(12) United States Patent
Zimmerman et al.

(10) Patent No.: US 8,575,641 B2
(45) Date of Patent: Nov. 5, 2013

(54) SOLID STATE LIGHT SOURCES BASED ON THERMALLY CONDUCTIVE LUMINESCENT ELEMENTS CONTAINING INTERCONNECTS

(75) Inventors: Scott M. Zimmerman, Basking Ridge, NJ (US); William R. Livesay, San Diego, CA (US); Richard L. Ross, Del Mar, CA (US); Eduardo DeAnda, San Diego, CA (US)

(73) Assignee: Goldeneye, Inc, San Diego, CA (US)

( * ) Notice: Subject to any disclaimer, the term of this patent is extended or adjusted under 35 U.S.C. 154(b) by 0 days.

(21) Appl. No.: 13/572,608

(22) Filed: Aug. 10, 2012

(65) Prior Publication Data

US 2013/0099264 A1    Apr. 25, 2013

Related U.S. Application Data

(60) Provisional application No. 61/574,925, filed on Aug. 11, 2011.

(51) Int. Cl.
*H01L 33/64* (2010.01)
(52) U.S. Cl.
USPC .................................. 257/98; 257/E33.075
(58) Field of Classification Search
USPC ............................................ 257/98, E33.075
See application file for complete search history.

(56) References Cited

U.S. PATENT DOCUMENTS

| | | | |
|---|---|---|---|
| 4,421,671 A | 12/1983 | Cusano et al. | |
| 4,466,930 A | 8/1984 | Greskovich et al. | |
| 4,849,639 A | 7/1989 | Born et al. | |
| 6,565,770 B1 | 5/2003 | Mayer et al. | |
| 6,630,691 B1 | 10/2003 | Mueller-Mach et al. | |
| 6,667,574 B2 | 12/2003 | Aoki et al. | |
| 6,696,703 B2 | 2/2004 | Mueller-Mach et al. | |
| 7,285,791 B2 | 10/2007 | Beeson et al. | |
| 7,422,801 B2 * | 9/2008 | Yamashita | 257/611 |
| 7,804,099 B2 | 9/2010 | Beeson et al. | |
| 7,855,449 B2 * | 12/2010 | De Graff et al. | 257/98 |
| 2005/0006659 A1 | 1/2005 | Ng et al. | |
| 2006/0284190 A1 | 12/2006 | Zimmerman et al. | |

OTHER PUBLICATIONS

J. R. Grammer, "Emissivity Coatings for Low-Temperature Space Radiators", NASA Contract NAS-3-7630, Sep. 30, 1966.

* cited by examiner

*Primary Examiner* — Chandra Chaudhari
(74) *Attorney, Agent, or Firm* — William Propp, Esq

(57) ABSTRACT

Solid state light sources based on LEDs mounted on or within thermally conductive luminescent elements provide both convective and radiative cooling. Low cost self-cooling solid state light sources can integrate the electrical interconnect of the LEDs and other semiconductor devices. The thermally conductive luminescent element can completely or partially eliminate the need for any additional heatsinking means by efficiently transferring and spreading out the heat generated in LED and luminescent element itself over an area sufficiently large enough such that convective and radiative means can be used to cool the device.

46 Claims, 21 Drawing Sheets

SOLID STATE LIGHT SOURCES BASED ON THERMALLY CONDUCTIVE LUMINESCENT ELEMENTS CONTAINING INTERCONNECTS

REFERENCE TO PRIOR APPLICATION

This application claims the benefit of U.S. Provisional Patent Application Ser. No. 61/574,925, which was filed on Aug. 11, 2011, which is herein incorporated by reference.

BACKGROUND OF THE INVENTION

This invention relates to solid state light sources based on LEDs mounted on or within thermally conductive luminescent elements, which provide both convective and radiative cooling. Low cost, self-cooling solid state light sources can be realized by also integrating the electrical interconnect of the LEDs and other semiconductor devices. The thermally conductive luminescent element can be used to completely or partially eliminate the need for any additional heatsinking means by efficiently transferring and spreading out the heat generated in LED and luminescent element itself over an area sufficiently large enough such that convective and radiative means can be used to cool the device.

Solid luminescent ceramic plates are disclosed in Born, U.S. Pat. No. 4,849,639, as scintillators for the conversion of shorter wavelength photons to longer wavelength photons. Born does not disclose the use of the ceramic plates to convert narrowband emission from solid state emitters into broadband visible light sources.

CeYag in ceramic, single crystal, and powder forms have been used since the early 1970s to convert blue wavelengths to yellow wavelengths for efficient coupling of flashlamp outputs into laser rods at Bell Labs and other institutions. Again, the use of these materials to convert blue/UV solid state emitters into broadband white light sources is not disclosed.

The formation of transparent and translucent luminescent YAG ceramics are disclosed in Cusano. U.S. Pat. No. 4,421,671, and Greskovich, U.S. Pat. No. 4,466,930. The use of these materials as scintillators, CRT faceplates, and X-ray screens is disclosed but not their use in solid state lighting.

The use of solid wavelength conversion elements to form self cooling light sources in which the solid wavelength conversion element is a ceramic, single crystal, composite and layered solid material is disclosed in Zimmerman, U.S. Pat. No. 7,285,791. Zimmerman discloses the use of solid wavelength conversion elements to form solid state light sources in U.S. Pat. No. 7,804,099. The use of high emissivity surfaces is not disclosed.

Mueller-Mach et al. in U.S. Pat. No. 6,696,703 disclose the deposition of a thin film phosphor directly on the LED die. However, as-deposited thin film phosphors have relatively poor wavelength conversion efficiency. A high-temperature annealing step is required in order to properly activate the phosphor. This annealing step can damage the semiconductor layers of the LED. In addition, the absorption cross-sections of most thin film phosphors are low, especially for blue and near ultraviolet (UV) excitations typically used within solid-state lighting. It is neither economical nor practical in most cases to create a sufficiently thick layer of luminescent material directly on the LED. Another drawback to depositing a phosphor directly on the LED die is that a large portion of the light generated within a deposited phosphor layer can be trapped due to total internal reflectance. The need therefore exists for a method to utilize high performance phosphors within an LED package such that the best phosphor can be used efficiently (e.g. with sufficient quantity, minimal backscatter, and maximum light extraction). The need also exists for a method to fabricate high efficiency phosphors without damaging the LED semiconductor layers. In addition, high emissivity is not disclosed.

Another important aspect of phosphors relates to characterization and overall device efficiency. Phosphors are typically characterized in terms of quantum efficiency and Stokes shift losses. As an example, a powder phosphor layer is deposited on a glass surface and excited. The luminescence is measured as a function of excitation energy and the result is usually compared to a standard phosphor of known quantum efficiency. The losses associated with Stokes shift can be subtracted and the result would be the intrinsic quantum efficiency. Several problems exist with this method of characterization such as backscattered light, coating thickness variability and light trapping. In the case of phosphor powders, the majority of the generated light can escape from the phosphor particles due to their substantially spherical nature and to scattering centers located on or in the material itself. The main problem measuring the efficiency of phosphor powders is backscattering of the light from thick samples. For deposited phosphor films or grown phosphor boules, however, the problem of measuring the phosphor efficiency is affected by light extraction. The majority of the light generated in the phosphor can be trapped within the material itself due to total internal reflection. Several approaches have been used to solve the total internal reflection problem including various roughening techniques and shaping approaches. In these cases, the overall efficiency becomes as much a function of the extraction means as the conversion efficiency. Deposited phosphor films have the added complication of a secondary substrate material with its associated indices and losses.

Mayer et al. in U.S. Pat. No. 6,565,770 describe thin interference pigment flakes that can be made on a flexible substrate and then mechanically removed by flexing the substrate. The dichroic reflectors discussed are used in security enhancement on money and other decorative optical effects. The use of luminescent materials is discussed but is related to the formation of a particular optical effect such as UV illumination for security markings. No explanation for improving the output efficiency of LEDs or other light emitting devices is discussed and no device based on integrating the phosphor layer with the excitation source to form an efficient solid-state lighting element is disclosed.

The use of flake-like phosphors is also discussed by Aoki et al. in U.S. Pat. No. 6,667,574 for use in plasma displays, but the patent again lacks any reference to solid-state lighting applications or methods to enhance their output. In addition, the above two applications are very much cost driven because of the large areas typically required in making a plasma display or the marking of money or decorative items. In order to maximize the performance of these wavelength-converting materials high temperature processing is preferred.

Mueller-Mach et al. in U.S. Pat. No. 6,630,691 disclose a thin single-crystal phosphor substrate onto which an LED structure is fabricated by epitaxial growth techniques. However, single-crystal phosphor substrates are expensive and finding a single crystal phosphor substrate that has the proper lattice match to allow the growth of the LED structure can be difficult.

Ng et al. in US Patent Application No. 20050006659 disclose a planar sheet of a single-crystal phosphor that is placed over the output surface of an LED as a portion of a preformed transparent cap. However, single-crystal phosphor sheets must be grown by epitaxial processes or sliced from bulk single crystals of phosphor material. Single crystal phosphor sheets are therefore too expensive for most practical applications. Planar sheets of polycrystalline phosphors are not disclosed in US Patent Application No. 20050006659. Bonding the planar sheet of a single-crystal phosphor directly to the surface of the LED to improve heat dissipation in the phosphor sheet is also not disclosed.

LEDs unlike conventional light sources such as incandescent bulbs cannot effectively cool themselves. As such additional heatsinking or cooling means are required to prevent overheating. This increases the cost of not only the light sources due to shipping costs and materials costs but also the fixtures that use those light sources. In general, the need exists for articles and means which allow LEDs to be used without the need for additional heatsinking means.

It is desirable to minimize the temperature difference between the junction or active region of the semiconductor device and the ambient atmosphere to effectively cool small semiconductor devices. It is also desirable to minimize the surface area needed to dissipate the heat generated by the semiconductor devices to the ambient atmosphere. While high thermal conductivity materials can be used to spread the heat out over a very large area, these high thermal conductivity materials come with the addition of significant weight and cost. In conventional LED devices several layers of interconnect exist between the LED die and the final light source. This approach is used because the lighting fixture manufacturers have historically not been required or had the capability to wirebond, flipchip attach or even solder components into their fixtures. Also the need to regularly replace light sources such as incandescent bulbs has led to a wide range of quick change interconnects like sockets and pin based connector. Lightweight self cooling solid state light sources would offer significant benefits to fixture manufacturers. Incandescent bulbs for instance are very lightweight generating over 1000 lumens while weighing only 50 grams and as such can be easily held in place using even simple pins and sockets. For the typical LED sources, this is not the case. The added weight of the heatsink and the need for a low resistance thermal connection between the LED package and the heatsink necessitates the use of complex multiple level interconnects. The need exists for LED light sources which are lightweight and easily incorporated into a wide range of lighting fixtures without the need for additional heatsinking or cooling means.

As is well known to those skilled in the art, phosphor conversion is typically used to broaden the narrow band emission of LEDs to more closely match the sun or incandescent spectrum. This is usually done via phosphor powders mixed into an organic matrix. Using this conventional approach, the heat generated in the phosphor powders is thermally isolated from the ambient by the organic matrix.

For example, blue InGaN LEDs are routinely coated with a thin organic layer containing phosphor powders. The organic material typically consists of a silicone or epoxy. As the LED efficiency and flux density has increased, more of the thermal losses are localized in the phosphor powders. Unfortunately, thermal conductivity of the luminescent layer is mainly determined by the thermal conductivity of the organic matrix material, which is typically around 0.1 W/m/K. Typically a 50 micron coating thickness for the luminescent organic layer prevents high scatter losses created by the index of refraction difference between the phosphor powder and organic matrix material. Conversely sufficient phosphor powder must be used to convert the shorter wavelength excitation to longer wavelength emission this is typically controlled by the loading level which is the ratio of the percentage of phosphor powder to the percentage of organic matrix material. A lower loading level of the phosphor powder reduces the thermal conductivity and a higher loading level limits the thickness of coating due to scatter losses.

Generically it is difficult to remove a significant amount of heat out of the phosphor powders, let alone the LEDs themselves, while they are in a low thermal conductivity matrix. Their luminescent efficiency typically decreases as the phosphor powders get hotter. This luminescent inefficiency has spurred the development of remote phosphor approaches which reduce the thermal load on the phosphor powders by moving the phosphor powder farther away from the LED and thereby reducing the flux density per unit area on the powder. This remote phosphor approach however increases the source size, amount of phosphor powder required, forms a thermal barrier around the LEDs, and creates a large volume light source.

In addition, organic systems are susceptible to blue and UV radiation due to the photostability of the C—H bonds which define an organic system. Photostabilization of especially transparent optical systems under intense solarization has limited the long-term use of transparent organics (plastics) in greenhouse and other outdoors applications. The solar constant is approximate 1000 optical watts per square meter, with less than 10% of that having a wavelength short enough to photochemically attack the C—H bond. A typical blue LED in solid state lighting applications will output up to 1 optical watt per square millimeter of which virtually all the wavelengths emitted are capable of adversely affecting the C—H bonds of organic materials. These irradiation levels represent four order of magnitude higher flux densities than greenhouse films experience. Accordingly, inorganic solutions are more desirable than organic solutions for thermal conductivity and photostability standpoints.

All wavelength conversion materials and semiconductor devices exhibit temperature dependent efficiency curves. Thermal roll-off occurs for Ce:YAG around 150 degrees C. Alternately, AlInGaP red diodes and InGaN blue die both exhibit some roll-off as the junction temperature exceeds 100 degrees C. It therefore becomes critical that the heat generated within a solid state lighting system is transferred to the surrounding ambient using the lowest possible thermal resistance path. In the case of natural convection cooling the amount of heat that can be transferred to the surrounding ambient (air) is determined by the natural convection heat transfer coefficient, the area of the surface, and the temperature of the surface relative to the surrounding air or ambient.

Radiative cooling can also contribute to cooling solid state lighting devices if the temperature difference between the junction temperature and the radiating surface is minimized over a sufficiently large high emissivity surface area of the lighting device. Proposed solutions such as forced convection cooling, heatpipes, and even liquid cooling, either move the heat around or substantially increase the volume and weight of the light source. These solutions result in very low lumens/gram light sources.

Historically, light sources have cooled themselves as stated earlier. In the case of incandescent and fluorescent tubes, the glass envelope surrounding the sources, and the filament or arc itself transfers the excess heat generated via convection and radiation. An incandescent bulb glass envelope can exceed 150 degrees C. and a halogen's quartz envelope may exceed several hundred degrees celsius. Radiative power scales as the fourth power of the temperature. A naturally convectively cooled surface with a surface temperature of 50 degrees C. in a 25 degrees C. ambient will transfer only about 5% of its energy to the surrounding ambient radiatively. A naturally convectively cooled surface with a surface temperature of 100 degrees C. can transfer 20% of its energy to the surrounding ambient radiatively. The typical LED junction temperature for high powered devices can be over 120 degrees C. and still maintain excellent life and efficiency. For surfaces with temperatures less than 120 degrees C. the majority of the radiated energy is in the infrared with a wavelength greater than 8 microns.

The emissivity of the materials in the infrared varies greatly. Glass has an emissivity of approximately 0.95 while aluminum oxide may be as low as 0.23. Organics such as polyimides can have fairly high emissivity in thick layers. This however will negatively affect the transfer of heat due to the low thermal conductivity of organics.

In order to maximize heat transfer to the ambient atmosphere, the need exists for luminescent thermally conductive materials which can effectively spread the heat generated by localized semiconductor and passive devices (e.g. LEDs, drivers, controller, resistors, coils, inductors, caps etc.) to a larger surface area than the semiconductor die via thermal conduction and then efficiently transfer the heat generated to the ambient atmosphere via convection and radiation. At the same time, these luminescent thermally conductive materials must efficiently convert at least a portion of the LED emission to another portion of the visible spectrum to create a self cooling solid state light source with high L/W efficiency and good color rendering.

Heat generated within the LEDs and phosphor material in typical solid state light sources is transferred via conduction means to a much larger heatsink usually made out of aluminum or copper. The temperature difference between the LED junction and heatsink can be 40 to 50 degrees C. The temperature difference between ambient and heatsink temperature is typically very small given the previously stated constraints on the junction temperatures of LEDs. This small temperature difference not only eliminates most of the radiative cooling but also requires that the heatsink be fairly large and heavy to provide enough surface area to effectively cool the LEDs. This added weight of the heatsink increases costs for shipping, installation and in some cases poses a safety risk for overhead applications.

Ideally, like incandescent, halogen, sodium, and fluorescent light sources, the emitting surface of the solid-state light source would also be used to cool the source. Such a cooling source would have an emitting surface that was very close to the temperature of the LED junctions to maximize both convective and radiative cooling. The emitting surface should be constructed of a material that exhibited sufficient thermal conductivity to allow for the heat from small but localized LED die to be spread out over a sufficiently large enough area to effectively cool the LEDs.

This invention discloses thermally conductive luminescent elements within solid state light sources which overcome these issues.

SUMMARY OF THE INVENTION

This invention relates to solid state light sources based on LEDs mounted on or within thermally conductive luminescent elements. The thermally conductive luminescent elements provide a substantial portion of the cooling of the LEDs using both convective and radiative cooling from the emitting surfaces. Electrical interconnect of the LEDs and other semiconductor devices based on opaque and/or transparent conductors create low cost self-cooling solid state light sources. The low cost self-cooling solid state light sources can have printed on, thick film printed silver conductors with a reflectivity greater than 30%.

Briefly, and in general terms, the self cooling light source of the invention comprises at least one light-emitting diode (LED) die; and at least one thermally conductive luminescent element. The luminescent element includes an electrical interconnect and performs multiple functions: as a wavelength converter, converting at least a portion of the light emitted by said LED die to a different wavelength range, as an optical waveguide for light emitted by said LED die, and as a heat spreading element, spreading heat generated by said LED die over a greater cross-sectional area. Finally the luminescent element provides a high emissivity layer, for optimal coupling of emitted light from the light source.

The thermally conductive luminescent element can be used to completely or partially eliminate the need for any additional heatsinking means by efficiently transferring and spreading out the heat generated in LED and luminescent element itself over an area sufficiently large enough such that convective and radiative means can be used to cool the device. In other words, the surface emitting light also convectively and radiatively cools the device. The thermally conductive luminescent element also provides for the efficient wavelength conversion of at least a portion of the radiation emitted by the LEDs.

The present invention may also be defined as a self cooling solid state light source comprising at least one light-emitting diode (LED) die and at least one thermally conductive luminescent element bonded to the at least one LED die; wherein heat is transmitted from the light source in basically the same direction as emitted light. More specifically, light is emitted from the LED die principally in a direction through the at least one luminescent element, and heat generated in the light source is transmitted principally in the same direction as the direction of light emission. Heat is dissipated from the light source by a combination of radiation, conduction and convection from the at least one luminescent element, without the need for a device heat sink.

Optionally, the luminescent thermally conductive element can provide light spreading of at least a portion of the radiation from the LEDs and/or radiation converted by the thermally conductive luminescent elements via waveguiding. A thermally conductive luminescent element acts as a waveguide with alpha less than 10 cm-1 for wavelengths longer than 550 nm. In this case, the LEDs with emission wavelengths longer than 550 nm can be mounted and cooled by the thermally conductive luminescent elements and also have at least a portion of their emission efficiently spread out via waveguiding within the thermally conductive luminescent element as well.

Thermally conductive luminescent elements with InGaN and AlInGaP LEDs can convert at least a portion of the InGaN spectrum into wavelengths between 480 and 700 nm. Single crystal, polycrystalline, ceramic, and/or flamesprayed Ce:YAG, Strontium Thiogallate, or other luminescent materials emitting light between 480 and 700 nm and exhibiting an alpha below 10 cm-1 for wavelengths between 500 nm and 700 nm can be a thermally conductive solid luminescent light spreading element.

The mounting of InGaN and AlInGaP LEDs can form solid state extended area light sources with correlated color temperatures less than 4500 K and efficiencies greater than 50 L/W and optionally color rendering indices greater than 80 based on these thermally conductive light spreading luminescent elements.

One embodiment of this invention is a luminescent thermally conductive translucent element having a thermal conductivity greater than 1 W/m/K consisting of one or more of the following materials, alumina, ALN, spinel, zirconium oxide, BN, YAG, TAG, and YAGG. Optionally, electrical interconnects maybe formed on at least one surface of the luminescent thermally conductive translucent element to provide electrical connection to the LED.

The luminescent thermally conductive element can have a thermal conductivity greater than 1 W/mlK and have an emissivity greater than 0.2. A self cooling solid state light source can have at least one luminescent thermally conductive element with a thermal conductivity greater than 1 W/m/K and an emissivity greater than 0.2. A self cooling solid state light source can have an average surface temperature greater than 50 degrees C. and a luminous efficiency greater than 50 L/W. Optionally, a self-cooling solid state light source can have an average surface temperature greater than 50 degrees C. and a luminous efficiency greater than 50 L/W containing at least one luminescent thermally conductive element with a thermal conductivity greater than 1 W/m/K and an emissivity greater than 0.2. A self-cooling solid state light source can dissipate greater than 0.3 W/cm2 via natural convection cooling and radiation cooling.

Luminescent thermally conductive elements can be formed via the following methods: crystal growth, sintering, coating, fusible coating, injection molding, flame spraying, sputtering, CVD, plasma spraying, melt bonding, and pressing. Pressing and sintering of oxides with substantially one phase will improve translucency based on a luminescent powder. Alternately, a translucent element with a thermal conductivity greater the 1 W/m/K and an alpha less than 10 cm-1 can be coated with a luminescent layer formed during the sintering process or after the sintering process. Single crystal or polycrystalline materials, both luminescent and non-luminescent, can be the thermally conductive luminescent element. Specifically TPA (transparent polycrystalline alumina), spinel, cubic zirconia, quartz, and other low absorption thermally conductive materials with a luminescent layer can be formed during or after fabrication of these materials. Techniques such as pressing, extruding, and spatial flame spraying can form near net shape or finished parts. Additional luminescent layers can be added to any of these materials via dip coating, flame spraying, fusing, evaporation, sputtering, CVD, laser ablation, or melt bonding. Controlled particle size and phase can improve translucency.

Coatings can improve the environmental and/or emissivity characteristics of the self-cooling light source, particularly if the coating is a high emissivity coating with and without luminescent properties. Single crystal, polycrystalline, ceramic, coating layers, or flame sprayed can be used both as a coating and as the bulk material Ce:YAG, with a high emissivity or environmental protective coating. In particular, polysiloxanes, polysilazanes and other transparent environmental overcoats can be applied via dip coating, evaporative, spray, or other coating methods, applied either before or after the attachment of the LEDs. Additional luminescent materials can be added to these overcoats such as but not limited to quantum dots, luminescent dyes (such as Eljen wavelength shifter dyes), and other luminescent materials.

Wireless power transfer elements, power conditioning element, drive electronics, power factor conditioning electronics, infrared/wireless emitters, and sensors can be integrated into the self-cooling solid state light source.

A self-cooling solid-state light source can have a luminous efficiency greater than 50 L/W at a color temperature less than 4500K and a color rendering index greater than 70. The self-cooling solid-state light source can have a surface temperature greater than 40 degrees C., convectively and radiatively cooling more than 0.3 W/cm2 of light source surface area, and having a luminous efficiency greater than 50 L/W.

A self-cooling solid-state light source can have a luminous efficiency great than 50 L/W at a color temperature less than 4500K and a color rendering greater than 85 containing both blue and red LEDs. At least one luminescent thermally conductive element with an alpha less than 10 cm-1 for wavelengths longer than 500 nm is used in the self cooling solid state light source containing at least one blue and at least one LED with emission wavelengths longer than 500 nm. Additional luminescent materials in the form of coatings and/or elements including, but not limited, to phosphor powders, fluorescent dies, wavelength shifters, quantum dots, and other wavelength converting materials, can further improve efficiency and color rendering index.

Aspect ratios and shapes for the solid state light source can be, including but not limited to, plates, rods, cylindrical rods, spherical, hemispherical, oval, and other non-flat shapes. Die placement can mitigate edge effects and form more uniform emitters. Additional scattering, redirecting, recycling, and imaging elements can be attached to and/or in proximity to the solid state light source designed to modify the far field distribution. Additional elements can be attached to the solid state light source with a thermally conductivity greater than 0.1 W/m/K such that additional cooling is provided to the solid state light source via conduction of the heat generated within the solid state light source to the additional element and then to the surrounding ambient. An external frame can provide mechanical support, can be attached to the solid state light source, and/or can provide an external electrical interconnect. Multiple solid state sources arranged with and without additional optical elements can generate a specific far field distribution. In particular, multiple solid state sources can be arranged non-parallel to each other such that surface and edge variations are mitigated in the far field. A separation distance between solid state light sources faces of greater than 2 mm is preferred to facilitate convective cooling. Mounting and additional optical elements can enhance convective cooling via induced draft effects.

In this invention, thermally conductive luminescent elements on to which semiconductor devices are mounted are used to effectively spread the heat out over a sufficient area with a low enough thermal resistance to effectively transfer the heat generated by the semiconductor devices and the thermally conductive luminescent element itself to the surrounding ambient by both convection and radiative means. In this invention, the surface emitting light convectively and radiatively cools the device.

The thermally conductive luminescent element also provides for the efficient wavelength conversion of at least a portion of the radiation emitted by the LEDs. Optionally, the luminescent thermally conductive element can provide light spreading of at least a portion of the radiation from the LEDs and/or radiation converted by the thermally conductive luminescent elements. The thermally conductive luminescent elements act as waveguides with alpha less than 10 cm-1 for wavelengths longer than 550 nm. In this case the LEDs with emission wavelengths longer than 550 nm can be mounted and cooled by the thermally conductive luminescent elements and also have at least a portion of their emission efficiently spread out via waveguiding within the thermally conductive luminescent element as well.

Disclosed is a self cooling solid state light source containing an optically transmitting thermally conductive element with a surface temperature greater than 50 degree C. and a surface area greater than the semiconductor devices mounted on the optically transmitting thermally conductive element. Even more preferably a self cooling solid state light source containing at least one optically transmitting thermally conductive element with a surface temperature greater than 100 degrees C. and a surface area greater than the surface area of the mounted semiconductor devices. Most preferred is a self cooling solid state light source containing at least one optically transmitting thermally conductive luminescent element with an average thermal conductivity greater than 1 W/m/K. As an example, YAG doped with 2% Cerium at 4 wt % is dispersed into an alumina matrix using spray drying. The powders are pressed into a compact and then vacuum sintered at 1500 degrees C. for 8 hours, followed by hot isostatic pressing at 1600 degrees C. for 4 hours under argon. The material is diamond saw diced into 1 mm thick pieces which are ½ inch×1 inch in area. The parts are laser machined to form interconnect trenches into which silver paste is screen printed and fired. The fired silver traces are then lapped to form smooth surface to which direct die attach LED die are soldered. Pockets are cut using the laser such that two pieces can be sandwiched together thereby embedding the direct die attach LED die inside two pieces of the ceramic CeYag/alumina material. In this manner, a self cooling light source is formed. The direct die attached LED are electrically interconnected via the silver traces and thermally connected to the ceramic CeYag/alumina material. The heat generated within the direct die attach LEDs and the ceramic CeYag/alumina material is spread out over an area greater than the area of the LEDs. In this example, power densities greater than 1 W/cm2 can be dissipated while maintaining a junction temperature less than 120 degrees C. and surface temperature on the ceramic CeYag/alumina material of 80 to 90 degrees C. based on natural convection and radiative cooling. As such a ¼ inch×½ inch solid state light source can emit over 100 lumens without any additional heatsinking or cooling means.

Materials with emissivities greater than 0.3 are preferred to enhance the amount of heat radiated of the surface of the solid state light source. Even more preferable emissivity ureater than 0.7 for surface temperatures less than 200 degrees C. A naturally convectively cooled surface with a natural convection coefficient of 20 W/m2/k with a surface temperature of 50 degrees C. in a 25 degrees C. ambient will transfer about 25% of its energy to the surrounding ambient radiatively if the surface emissivity is greater than 0.8 and can dissipate approximately 0.08 W/cm2 of light source surface area. A similar naturally convectively cooled surface with a surface temperature of 100 degrees C. can transfer 30% of its energy to the surrounding ambient radiatively and dissipate greater than 0.25 watts/cm2 of surface area. A similar naturally convectively cooled surface with a surface temperature of 150 degrees C. can transfer 35% of the heat radiatively and dissipate greater than 0.4 watts/cm2. Given that solid state light sources can approach 50% electrical to optical conversion efficiency and that the typical spectral conversion is 300 lumens/optical watt using this approach a self cooling solid state light source can emit 75 lumens for every 1.0 cm2 of light source surface area. As an example, a ¼ inch×½ inch×2 mm thick self cooling light stick can generate more than 150 lumens while maintaining a surface temperature less than 100 degrees C. The typical LED junction temperature for high powered devices can be over 120 degrees C. and still maintain excellent life and efficiency. For surfaces with temperatures less than 120 degrees C. the majority of the radiated energy is in the infrared with a wavelength greater than 8 microns. As such high emissivity coatings, materials, and surfaces which are substantially transparent in the visible spectrum are preferred embodiments of self cooling light sources.

The emissivity of the materials in the infrared varies greatly. Glass has an emissivity of approximately 0.95 while aluminum oxide may be between 0.5 and 0.8. Organics such as polyimides can have fairly high emissivity in thick layers. This however will negatively affect the transfer of heat due to the low thermal conductivity of organics. As such high thermal conductivity high emissivity materials and coating are preferred. High emissivity/low visible absorption coatings are described in J. R. Grammer, "Emissivity Coatings for Low-Temperature Space Radiators", NASA Contract NAS 3-7630 (30 Sep. 1966). Various silicates are disclosed with emissivity greater than 0.85 and absorptions less than 0.2.

In order to maximize heat transfer to the ambient atmosphere, the need exists for luminescent thermally conductive materials which can effectively spread the heat generated by localized semiconductor and passive devices (e.g. LEDs, drivers, controller, resistors, coils, inductors, caps etc.) to a larger surface area than the semiconductor die via thermal conduction and then efficiently transfer the heat generated to the ambient atmosphere via convection and radiation. At the same time, these luminescent thermally conductive materials must efficiently convert at least a portion of the LED emission to another portion of the visible spectrum to create a self cooling solid state light source with high L/W efficiency and good color rendering. Conventional wavelength converters in both solid and powder form are substantially the same size as the LED die or semiconductor devices. This minimizes the volume of the luminescent material but localizes the heat generated within the luminescent element due to stokes losses and other conversion losses. In present day solid state light sources approximately 50% of the heat generated is within the luminescent material. By using a thermally conductive luminescent element with low dopant concentration which also acts as a waveguide to the excitation light emitted by the LEDs the heat generated by the luminescent conversion losses can be spread out over a larger volume. In addition a more distributed light source can be generated rather localized point sources as seen in conventional LED packages. In this manner the need for addition diffusing and optical elements can be eliminated or minimized. As such the use of luminescent thermally conductive elements with surface area greater than the semiconductor devices mounted on the luminescent elements is a preferred embodiment.

Heat generated within the LEDs and phosphor material in typical solid state light sources is transferred via conduction means to a much larger heatsink usually made out of aluminum or copper. The temperature difference between the LED junction and heatsink can be 40 to 50 degrees C. The temperature difference between ambient and heatsink temperature is typically very small given that significant temperature drop occurs from the LED junction and the heatsink surfaces. This small temperature difference not only eliminates most of the radiative cooling but also requires that the heatsink be fairly large and heavy to provide enough surface area to effectively cool the LEDs. The larger the heatsink, the larger the temperature drop between the LED junction and the surface of the heatsink fins. For this reason, heatpipes and active cooling is used to reduce either the temperature drop or increase the convective cooling such that a smaller heatsink volume can be used. In general, the added weight of the heatsink and/or active cooling increases costs for shipping, installation, and in some cases poses a safety risk for overhead applications.

Ideally, like incandescent, halogen, sodium, and fluorescent light sources, the emitting surface of the solid-state light source would also be used to cool the source. Such a cooling source would have an emitting surface that was very close to the temperature of the LED junctions to maximize both convective and radiative cooling. The emitting surface should be constructed of a material that exhibited sufficient thermal conductivity to allow for the heat from small but localized LED die to be spread out over a sufficiently large enough area to effectively cool the LEDs. In this invention this is accomplished by spreading the heat generated within the luminescent element out over a larger volume, using a thermal conductivity luminescent element that spreads the heat generated in the semiconductor devices used via conduction over a larger surface area than the semiconductor devices, and maximizing the radiative and convective cooling by high emissivity coatings, increased surface area, and higher surface temperatures created by efficient coupling of the heat to the surface of the self cooling light source.

DETAILED DESCRIPTION OF DRAWINGS

Figure 1A:
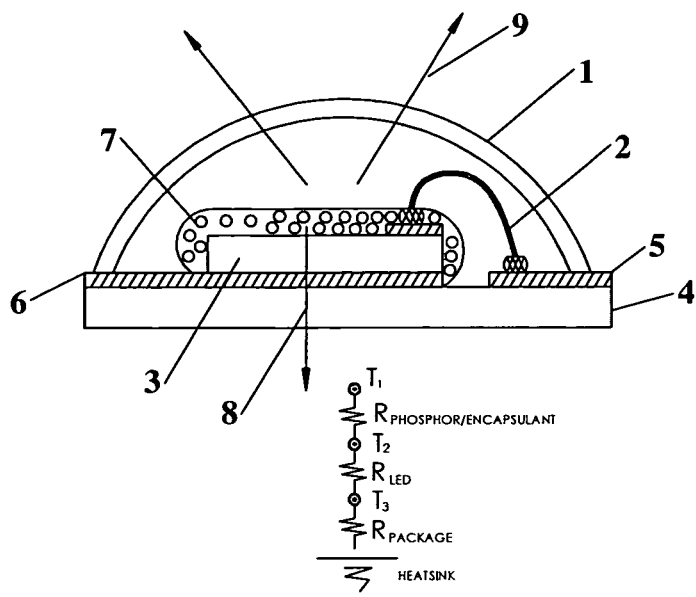
FIGS. 1A and 1B depict side views of prior art vertical and flip chip mounted LED packages and thermal schematics where the optical emission is substantially in the opposite direction of the heat removal.

FIG. 1A depicts a prior art vertical LED die 3 mounted on a substrate 4. The vertical LED die 3 is typically coated with an inorganic/organic matrix 7 consisting of phosphor powder such as, but not limited to, Ce:YAG in a silicone resin material. The wire bond 2 is used to electrically connect vertical LED die 3 to interconnect 5 which is then coated with the inorganic/organic matrix 7. The other side of vertical LED die 3 is contacting interconnect 6 usually via eutectic solder or conductive adhesives. A lens 1 is further attached to substrate 4 to environmentally seal the assembly, enhance light extraction from vertical LED die 3, and modify the far field optical pattern of the light emitted by the device. In this case, emitted rays 9 are substantially traveling in the opposite direction of the heat ray 8.

As shown in the thermal schematic in FIG. 1A, cooling of the inorganic/organic matrix 7 occurs almost exclusively via thermal conduction through the vertical LED die 3 and into the substrate 4 via interconnect 6. The heat generated within inorganic/organic matrix 7 due to Stokes losses and scattering absorption is thermally conducted to the vertical LED die 3 at a rate determined by the thermal resistance determined by the bulk thermal conductivity of the inorganic/organic matrix 7. As shown in the simplified thermal schematic, the average temperature of the inorganic/organic matrix 7 is determined by the thermal resistance R(phosphor/encapsulant) and T2 the average temperature of the vertical LED die 3. In order for heat generated within the inorganic/organic matrix 7 to be dissipated to the ambient, it must move the thermal resistance of LED die 3 (RLED) and substrate 4 (RPackage) before it can be dissipated to the ambient. This is a simplified thermal schematic which lumps bulk and interface thermal resistances and spatial variations within the device. But in general, heat generated within the inorganic/organic matrix 7 must be dissipated mainly through the vertical LED die 3 due to low thermal conductivity of the other materials (e.g. Lens) which surround inorganic/organic matrix 7. Additional heatsinking means can further increase the surface area using metal, composite, or ceramic elements to enhance the dissipation of heat to ambient but the flow of heat is still basically the same. The lens 1 acts as an extraction element for the emitted light rays 9 but also acts as a barrier to thermal rays 8. Typically constructed of silicone or epoxy resins with thermal conductivity less than 0.1 W/m/K, Lens 1 acts as a thermal insulator. Lens 1 also can limit thermal radiation from vertical LED 3 and inorganic/organic matrix 7 due to low emissivity. In general this design requires that approximate 50% of the isotropic emission from the active region within vertical LED 1 must be reflected off some surface within the device and that the far field output of the device be substantially directional or lambertian in nature. Even with the use of highly reflective layers, this represents a loss mechanism for this approach. These extra losses are associated with the added pathlength that the optical rays must go through and multiple reflections off the back electrodes. This added pathlength and reflections, which are required to extract the light generated in the active region of vertical LED 1, fundamentally reduces the efficiency of the LED based on the absorption losses of the LED itself. A significant portion of the light generated within the inorganic/ organic matrix 7 must also pass through and be reflected by vertical LED 1. Since vertical LED 1 is not a lossless reflector, the added pathlength of these optical rays also reduce overall efficiency.

Figure 1B:
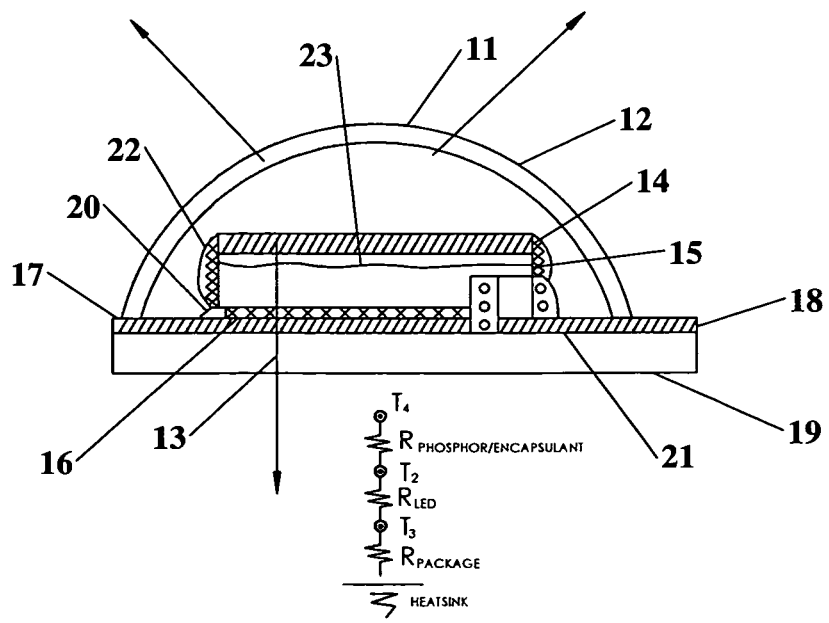

FIG. 1B depicts a prior art flipchip mounted LED 15. Solder or thermocompression bonding attaches flipchip mounted LED 15 via contacts 16 and 21 to interconnects 17 and 18 respectively on substrate 19. Luminescent converter 14 may be an inorganic/organic matrix as discussed in FIG. 1A or solid luminescent element such as a Ce:YAG ceramic, single crystalline Ce:YAG, polycrystalline Ce:YAG or other solid luminescent materials as known in the art. In either case, the same cooling deficiency applies with this design. Virtually all the cooling of the luminescent converter 14 must be through the flipchip mounted LED 15. Again, emission rays 12 travel in a direction substantially opposite to thermal rays 13 and once again approximately 50% the isotropic emission of the active region of the flipchip mounted LED 15 must to redirected within the device requiring the use of expensive metals like Ag, specialized coating methods and even nano-lithography as in the case of photonic crystals.

The formation of contacts which are both highly reflective over a large portion of the LED die area and still forms a low resistivity contact has been a major challenge for the industry due to reflectivity degradation of Ag at the temperature typically required to form a good ohmic contact. This high light reflectivity and low electrical resistivity leads to added expense and efficiency losses. Because both the contacts must be done from one side typically an underfill 20 is used to fill in the voids created by the use of flipchip contacts. Lens 11 again forms a barrier to heat flow out of the device from both convectively and radiatively. The luminescent converter 14 is typically attached after the flipchip mounted die 15 is mounted and interconnected to substrate 19. A bonding layer 23 between the flipchip mounted die 15 and luminescent element 14 further thermally isolates the luminescent element 14. Typically, InGaN power LED UV/Blue chips exhibit efficiencies approaching 60% while White InGaN power LED packages are typically 40%. The loss within the luminescent converter 14 therefore represents a substantial portion of the total losses within the device. In the case of an inorganic/organic matrix luminescent converter of FIG. 1A, the conversion losses are further localized within the individual phosphor powders due to the low thermal conductivity of the silicone or epoxy matrix. The solid luminescent converter 14 has more lateral spreading due to the higher thermal conductivity of the solid material. Both cases are typically Cerium doped YAG with an intrinsic thermal conductivity of 14 W/m/K. However since the silicone matrix has a thermal conductivity less than 0.1 W/m/K and surrounds substantially all the phosphor powders, the inorganic/organic matrix has a macro thermal conductivity roughly equivalent to the silicone or epoxy by itself. Very high loading levels of phosphor powder can be used but lead to efficiency losses due to higher scatter.

There is simply nowhere for the heat generated in luminescent converter 14 to go except be thermally conducted into the flipchip mounted LED 15 via the bonding layer 23. In most cases, solid luminescent converters 14 must have an additional leakage coating 22 that deals with blue light that leaks out of the edge of the flipchip mounted LED 15. An inorganic/organic matrix suffers from the same issues in FIG. 1A. In both FIGS. 1A and 1B, the emission surface are substantially different from the cooling surfaces. The thermal schematic for FIG. 1B is similar to FIG. 1A in that heat generated within the luminescent converter 14 is substantially dissipated through the flipchip mounted LED 15. With the advent of high powered LEDs, a substantially portion of the heat generated within the device can be localized within luminescent converter 14. This localization has led to a variety of solutions including the use of remote phosphors. In general, luminescent converter 14 efficiency reduces as its average temperature T4 increases. In the prior art the luminescent converter 14 dissipates the majority of its heat through the flipchip mounted LED 15 with an average temperature of T5. This is an inherently higher temperature than the ambient. The need exists for techniques whereby the heat generated within luminescent converter 14 can be reduced for higher efficiency devices.

Figure 2A:
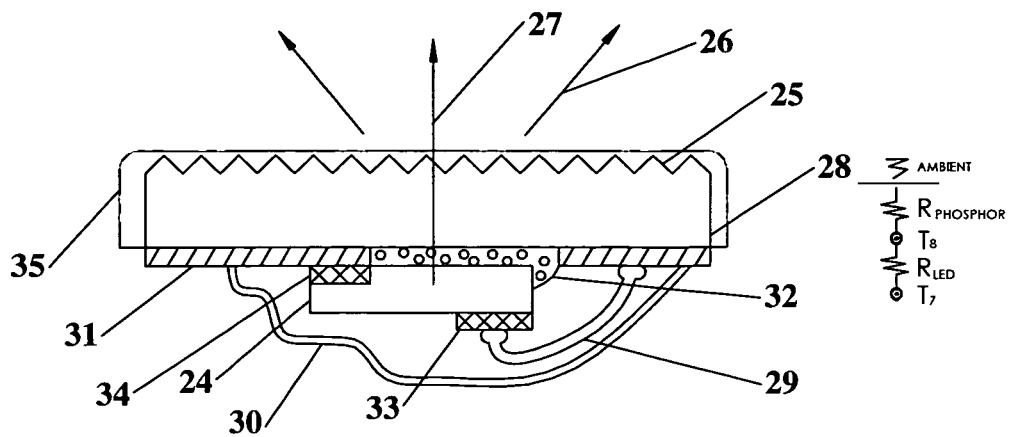
FIGS. 2A, 2B and 2C depict side views of self-cooling solid state light sources using luminescent thermally conductive luminescent elements and interconnects with thermal schematics of the present invention.

FIG. 2A depicts a vertical LED 24 of the present invention in which the optical emission rays 26 travel substantially in the same direction as the thermal rays 27. A thermally conductive luminescent element 25 provides wavelength conversion for at least a portion of the light emitted by vertical LED 24 and acts as an optical and thermal spreading element, extraction means, and a substrate for the electrical interconnect. In FIG. 2A, overcoat 30 may be reflective, transparent, partially reflective and exhibit reflectivity which is wavelength and/or polarization dependent.

Wire bond 29 connects interconnect 28 to eutectic pad 33 with contact 34 attached via conductive ink or eutectic solder to interconnect 31. A transparent/translucent bonding layer 32 maximizes optical and thermal coupling into thermally conductive luminescent element 25 and eventually out of the device. The transparent/translucent bonding layer 32 may consist of, but is not limited to, glass frit, polysiloxane, polysilazane, silicone, and other transparent/translucent adhesive materials. Transparent/translucent bonding layer 32 has a thermal conductivity greater than 0.1 W/m/K and even more preferably greater than 1 W/m/K. Thermally conductive luminescent element 25 may consist of, but is not limited to, single crystal luminescent materials, polycrystalline luminescent materials, amorphous luminescent materials, thermally conductive transparent/translucent materials such as Sapphire, TPA, Nitrides, Spinel, cubic zirconia, quartz, and glass coated with a thermally conductive luminescent coating, and composites of thermally conductive transparent/translucent material and thermally conductive luminescent materials.

In FIG. 2A a high emissivity layer 35 may be applied to the thermally conductive luminescent element 25 to enhance radiative cooling. In addition, high emissivity layer 35 may also provide enhanced extraction efficiency by acting as an index matching layer between the surrounding air and the thermally conductive luminescent element 25, especially in the case where extraction elements are used to increase extraction from the thermally conductive luminescent element 25. Unlike the previous prior art thermal schematic, the flow of heat generated in the thermally conductive luminescent element 25 is directly coupled to the ambient via convective and radiative cooling off the surface of the thermally conductive luminescent element 25 itself. This direct coupling approach can only be effectively accomplished if the bulk thermal conductivity of the thermally conductive luminescent element 25 is high enough to effectively spread the heat out over an area sufficiently large enough to effective transfer the heat to the surrounding ambient. As such, a thermally conductive luminescent element has a surface area greater than the attached LED with an average bulk thermal conductivity greater than 1 W/m/K wherein the heat generated within the Vertical LED 24 and thermally conductive luminescent element 25 are substantially transferred to the surrounding ambient via convection and radiation off the surface of thermally conductive luminescent element 25. High emissivity layer 35 most preferably has an emissivity greater than 0.8 at 100 degrees C. and an absorption less than 0.2 throughout the visible spectrum. Alternately, the emissivity of the thermally conductive luminescent element 25 may be greater than 0.8 at 100 degrees C. and have an absorption less than 0.2 throughout the visible spectrum.

Figure 2B:
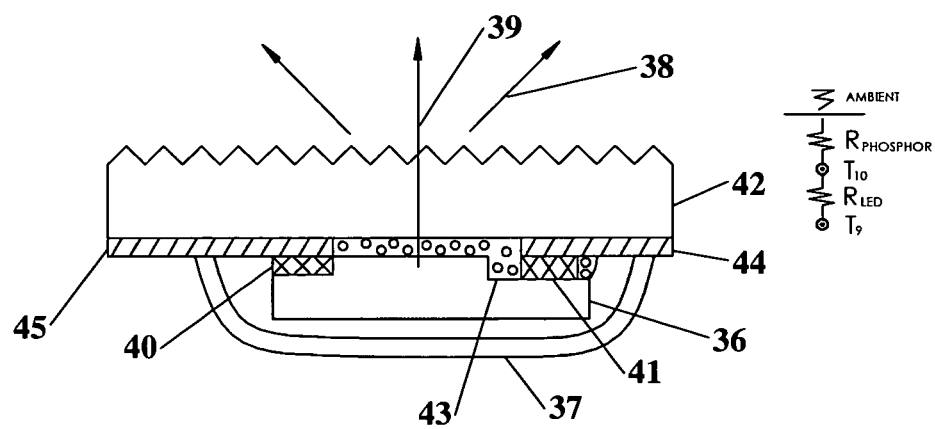

FIG. 2B depicts a flip chip mounted LED 36 mounted on thermally conductive luminescent element 42 via a transparent/translucent bonding layer 43 and electrically connected via contacts 41 and 40 to interconnects 44 and 45 on thermally conductive luminescent element 25. Interconnects 44 and 45 are thick film silver conductors formed via screen printing, inkjet printing, lithographic means, or combinations of these other methods. As an example, thermally conductive luminescent element 42 may contain a laser cut trench approximately 5 micron deep into which silver paste is screen printed and fired. The surface of conductive luminescent element 42 is then optionally lapped to create a smooth surface for interconnect 44 and 45. The resulting surface is now smooth enough for thermo compression bonded die, direct die attach die with integral eutectic solders, and other direct attach bonding methods. The interconnects 44 and 45 are typically fired at a temperature greater than 400 degrees C. The interconnects 44 and 45 are thick film or inkjet silver traces with line widths less than or greater than the width of the flip chip mounted LED 36. Optical losses within the device can be minimized by minimizing the amount of silver used, minimizing the width of the interconnect traces and maximizing the reflectivity of the silver traces. Alternately, the thermal resistance between flip chip mounted LED 36 and the thermally conductive luminescent element 42 may be minimized by increasing amount of silver thickness or area. Overcoat 37 may consist of, but is not limited to, glass frit, polysiloxane, polysilazanes, flame sprayed ceramics, and evaporative/CVD coatings. A highly reflective layer in overcoat 37 is optional. In this manner, a compact directional light source can be formed. Transparent/translucent bonding layer acts as an environmental and shorting barrier for the device. The reflector in overcoat 37 can be applied after all the high temperature processing thereby maximizing reflectivity of the layer. The thermal schematic shown in FIG. 2B again shows that there is a much different thermal conduction path than FIG. 1 devices. Thermally conductive luminescent element 42 provides the cooling surfaces for the device as well as conversion of light from LED 36. The emitting surface of the device is also the cooling surface of the device.

Figure 2C:
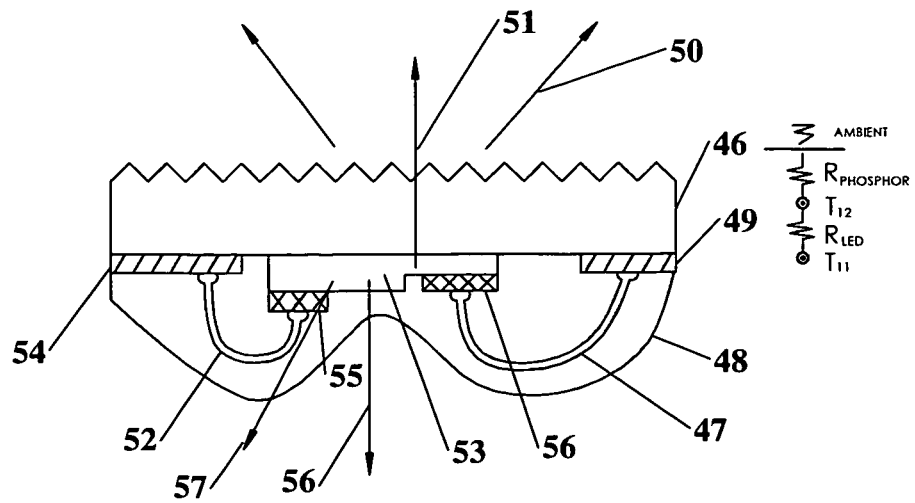

FIG. 2C depicts a lateral LED 53 mounted onto thermally conductive luminescent element 46. As in FIG. 2A and FIG. 2B, the optical emission 50 and thermal rays 51 travel in substantially the same direction. In this configuration, a transparent/translucent overcoat 48 couples thermal rays 56 and optical emission 57 out the backside of the device. Optical emission 50 and optical emission 57 maybe the same or different from each other regarding emission spectrum, intensity, or polarization. Additives, coatings, and combinations of both can effect the emission spectrum, intensity and polarization within overcoat 48. Interconnect 49 and 54 may consist of, but are not limited to, electrically conductive materials in a dielectric matrix. A silver flake thick film paste screen can be printed and fired at greater than 400 degrees C. with a reflectivity greater than 50% to form an electrically conductive material in a dielectric matrix. Wire bond 47 and 52 connect LED contacts 56 and 55 to interconnect 49 and 54 respectively. Gold wire is preferred but the wire bond can be silver, silver coated gold, and aluminum in wire, foil, and tape form. The thermal schematic illustrates the flow of heat through the device to ambient. Transparent/translucent overcoat 48 may also contain luminescent materials. As an example, transparent/translucent overcoat 48 may consist of inorganic/organic matrix material such as but not limited to HT 1500 Polysilazane (Clariant Inc.) containing at least one luminescent materials such as, but not limited to, Eljen EJ-284 fluorescent dye for conversion of green and yellow emission into red. Luminescent coatings can be applied via dip coating, spraying, inkjet, and other deposition techniques to form transparent/translucent overcoat 48 on a light emitting device containing at least one thermally conductive luminescent element 46.

Figure 3A:
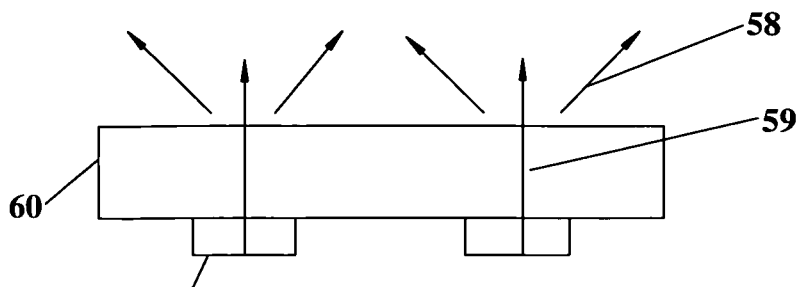
FIGS. 3A, 3B and 3C depict side views of a self-cooling solid state light source with multiple die of the present invention.

FIG. 3A depicts a self cooling light source consisting of a single thermally conductive luminescent element 60 attached both thermally and optically onto at least one LED 61. LED 61 may consist of InGaN, GaN, AlGaN, AlinGaP, ZnO, AlN, and diamond based light emitting diodes. Both blue and red light emitting diodes such as, but not limited to, InGaN and AlinGaP LEDs are attached optically and thermally to at least one thermally conductive luminescent element 60. Heat 59 and emission 58 generated by the LED 61 and the thermally conductive luminescent element 60 are spread out over a substantially larger area and volume than the LED 61. In this manner the heat generated can be effectively transferred to the surrounding ambient.

Ce:YAG in single crystal, polycrystalline, ceramic, and flame sprayed forms are preferred materials choices for thermally conductive luminescent element 60. Various alloys and dopants may also be used consisting of but not limited to gadolinium, gallium, and terbium. The thermally conductive luminescent element 60 can be single crystal cerium doped YAG grown via EFG with a cerium dopant concentration between 0.02% and 2%, preferably between 0.02% and 0.2% with a thickness greater than 500 microns. Alternatively, the thermally conductive luminescent element 60 can be flame sprayed Ce:YAG with an optional post annealing. The thermally conductive luminescent element 60 can be formed by flame spraying, HVOF, plasma spraying under a controlled atmosphere directly onto the LED 61. This approach maximizes both thermal and optical coupling between the thermally conductive luminescent element and LED 61 by directly bonding to LED 61 rather than using an intermediary material to bond the LED 61 to thermally conductive luminescent element 60. Alternately, the thermally conductive luminescent element 60 maybe formed using at least one of the following methods; hot pressing, vacuum sintering, atmospheric sintering, spark plasma sintering, flame spraying, plasma spraying, hot isostatic pressing, cold isostatic pressing, forge sintering, laser fusion, plasma fusion, and other melt based processes. Thermally conductive luminescent element 60 may be single crystal, polycrystalline, amorphous, ceramic, or a melted composite of inorganics. As an example, 100 grams alumina and Ce doped Yag powder which have been mixed together are placed into a container. The powders are melted together using a 2 Kw fiber laser to form a molten ball within the volume of the powder. In this manner the powder acts as the crucible for the molten ball eliminating any contamination from the container walls. The use of the fiber laser allows for formation of the melt in approximately 4 seconds depending on the beam size. While still in a molten state the ball may optionally be forged between SiC platens into a plate. Most preferably the molten ball is greater than 10 mm in diameter to allow sufficient working time as a molten material for secondary processing The plate may be further processed using vacuum sintering, atmospheric sintering, or hot isostatic pressing to form a translucent thermally conductive luminescent element 60. The use of fiber laser based melt processing is a preferred method for the formation of luminescent oxides, nitrides, and oxynitrides as a method of reducing energy costs compared to hot pressing or vacuum sintering. The use of controlled atmospheres including vacuum, oxygen, hydrogen, argon, nitrogen, and ammonia during the laser based melting processes is disclosed. While fiber lasers are preferred the use of localized actinic radiation to form a molten mass within a powder mass to form thermally conductive luminescent element 60 is disclosed.

Figure 3B:
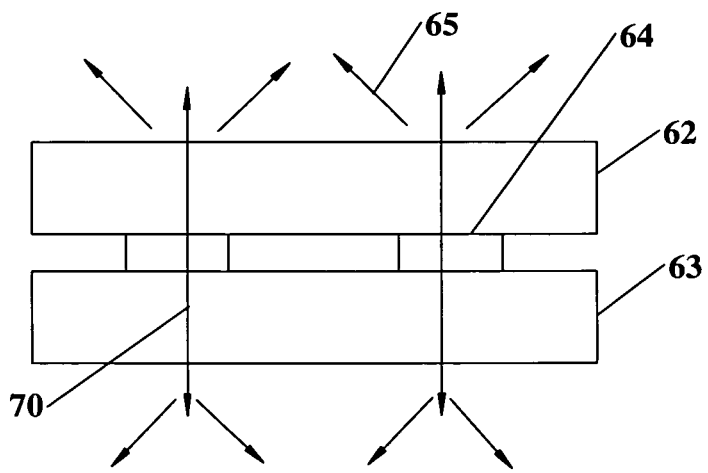

FIG. 3B depicts a self cooling light source consisting of at least two thermally conductive luminescent elements 62 and 63 attached to at least one LED 64. In this case, both thermal emission 64 and optical emission 65 can be spread out and extracted from both sides of LED 64. In all cases, multiple LEDs allow for parallel, series, anti-parallel, and combinations of all three with the appropriate electrical interconnect. In this case, optical emission 65 can be substantially similar or different on the two sides of the devices. As an example, thermally conductive luminescent element 62 can be 1 mm thick single crystal Ce doped YAG formed via EFG bottle which is then sliced into 19 mm×6 mm wafers. The sliced surface enhances extraction of the Ce:YAG emission out of the high index of refraction Ce:YAG material. Alternately, thermally conductive luminescent element 63 may be a pressed and sintered translucent polycrystalline alumina with a thermally fused layer of Mn doped Strontium Thiogallate and a layer of Eu doped Strontium Calcium Sulfide within a glass frit matrix. In this manner, a wide range of optical emission spectrums can be created.

In this particular case, the two sides of the devices will emit slightly different spectrums. In general, unless an opaque reflector is placed between thermally conductive luminescent elements 62 and 63 there will be significant spectral mixing within this device. This configuration can be used for quarter lights, wall washers, chandeliers, and other light fixtures in which a substantial portion of the optical emission 65 is required to occur in two separate directions. Directional elements such as BEF, microoptics, subwavelength elements, and photonic structures impart more or less directionality to the optical emission 65 of either thermal conductive luminescent elements 62 and/or 63.

In another example, Cerium doped YAG is formed via flame, HVOF, or plasma spraying and then optionally annealed, spark plasma sintered, microwave sintering, or HIP to improve its luminescent properties for one or both thermally conductive luminescent element 62 and/or 63. At least one InGaN LED and at least one AlInGaP LEDs are used for at least one LED 64.

In yet another example, high purity aluminum oxide is flamesprayed directly onto at least one LED die 64 for thermally conductive luminescent element 62 forming a translucent reflector. The emissivity of flame sprayed aluminum oxide is typically 0.8 allowing for enhanced radiative cooling from that surface. Thermally conductive luminescent element 63 is single crystal Ce:YAG formed via skull melting and sliced into 0.7 mm thick wafers 0.5 inch×1 inch in area with a cerium doping concentration between 0.1% and 2%. In this case thermally conductive luminescent element 62 does not necessarily contain a luminescent material but acts as diffuse reflector and thermal spreading element for the heat generated by both LED 64 and thermally conductive luminescent element 62. By embedding LED 64 directly into thermally conductive luminescent element 62 it is possible to eliminate pick and place, die attachment processes and materials, and maximize both thermal transfer 64 and optical emission 65 by eliminating unnecessary interfaces. Additional luminescent materials and opaque reflectors can be positioned within or coating onto either thermally conductive luminescent elements 62 or 63. Pockets or embedded die can recess the die such that printing techniques including but not limited to inkjet, silkscreen printing, syringe dispensing, and lithographic means.

Figure 3C:
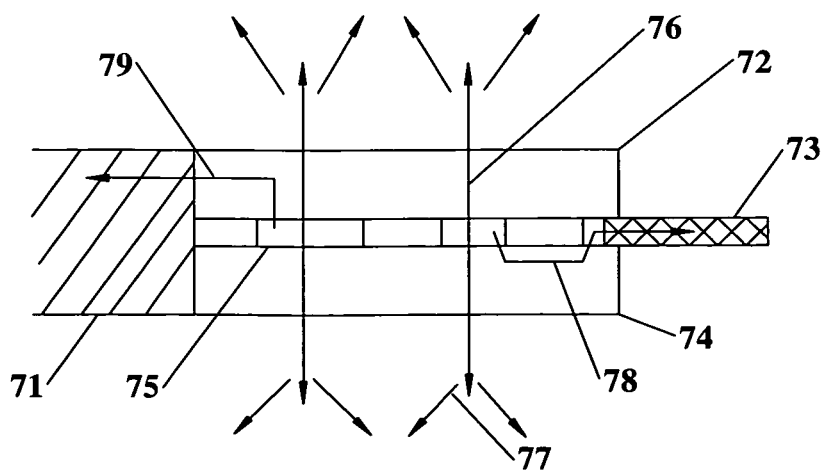

FIG. 3C depicts two thermally conductive luminescent elements 72 and 74 providing thermal conduction paths 74 and 79 to additional cooling means 71 and 73. In this case, thermally conductive luminescent elements 72 and 74 allow for thermal emission 76 and optical emission 77 and also provide for thermal conduction paths 74 and 79. Additional cooling means 71 and 73 may also provide for electrical connection to LED 75 via interconnect means previously disclosed in FIG. 2. One or more additional cooling means 71 and 73 further enhance the amount of heat that can be dissipated by the device. As an example, a typical natural convection coefficient is 20 W/m2/K and CeYag has an emissivity of 0.8 near room temperature. A self cooling light source consisting of two ¼ inch×½ inch×1 mm thick pieces of CeYag 72 and 74 with four direct attach LEDs 75 soldered on silver thick film interconnect traces has a surface area of approximately 2.3 cm2. Using natural convection and radiative cooling approximately 500 milliwatts of heat can be dissipated off the surface of the self cooling light source if the surface temperature is approximately 100 degrees C. and the ambient is 25 degrees C. and the emissivity is 0.8. Of the 500 milliwatts, 350 milliwatts of heat is dissipated via natural convection cooling and 150 milliwatts are dissipated via radiation. A typical 4000K spectrum output has an optical efficiency of 300 lumens per optical watt. If the solid state light source has a electrical to optical conversion efficiency of 50%, 500 milliwatts of optical output is generated for every 500 milliwatts of heat generated. Under these conditions a ¼ inch×½ inch solid state light source operating with a surface temperature of approximately 100 degrees C. can output 150 lumens without the need for additional heatsinking means. The use of additional cooling means 71 and 73 can be used to significantly increase this output level by increase the surface area that heat can be convectively and radiatively transferred to the ambient. As is easily seen in the example, increasing the surface area is directly proportional to amount of heat that can be dissipated. It is also clear that the electrical to optical conversion efficiency dramatically effects the amount of heat generated which a key attribute of this invention. Unlike conventional LED packages light generated within this self cooling solid state light source is extracted out of both sides of the device. Isotropic extraction as shown has a 20% theoretical higher efficiency than lambertian extraction. Also using this approach, the temperature difference between the LED 75 junction and the surfaces of thermally conductive luminescent elements 72 and 74 can be very low if the thermal conductivity is greater than 10 W/m/K and the LEDs 75 are attached such that there is low thermal resistance to the surrounding thermally conductive luminescent elements 72 and 74. In addition, cooling means 71 and 73 may be physically different to allow for the device to connect to different external power sources correctly. As an example, cooling mean 71 may be a pin and cooling means 73 maybe a socket such that a keyed electrical interconnect is formed. Alternately, cooling means 71 and 73 may contain magnets which allow for attachment of external power sources. Even more preferably the magnets have different polarity such that a keyed interconnect can be formed. Additional cooling means 71 and 73 may include, but are not limited to, heatpipes, metals, glass, ceramics, boron nitride fibers, carbon fibers, pyrolytic graphite films, and thermally conductive composites. As an example, boron nitride nano tubes fibers, as provided by BNNT Inc., are pressed with exfoliated boron nitride flakes to form and thermally interconnected skeleton matrix using pressing, cold isostatic pressing, warm isostatic pressing, and/or hot isostatic pressing to form a solid sheet. The boron nitride nanotube fibers interconnect the boron nitride flakes and bond to the surface of the boron nitride flakes such that a continuous thermal matrix is formed. The resultant skeleton matrix may then be infused with polymeric or polymeric ceramic precursors including but not limited to polysilazane, polysiloxane, glasses, silicones, and other polymeric materials to form a composite. Alternatively, The boron nitride nano tube fibers may be foamed into a yarn and woven into a cloth or felt and then infused with to form a thermally conductive composite. Alternately, high thermal conductivity carbon fibers and films may be used but boron nitride is preferred due to its low optical absorption compared to carbon based approaches. Alternately, carbon based additional cooling means 71 and 73 may include a reflective layer to reduced absorption losses and redirect light from the source as well as provide additional cooling. Additional cooling means 71 and 73 may also diffuse, reflect, or absorb optical emission 77 emitting between or from the adjacent edge of thermally conductive luminescent element 72 or 74. In this manner the far field emission of the device can be adjusted both from an intensity and spectral standpoint. Doubling the surface cooling area using additional cooling means 71 and 73 approximately doubles the lumen output as long as the thermal resistance of the additional cooling means 71 and 73 is low.

Figure 4A:
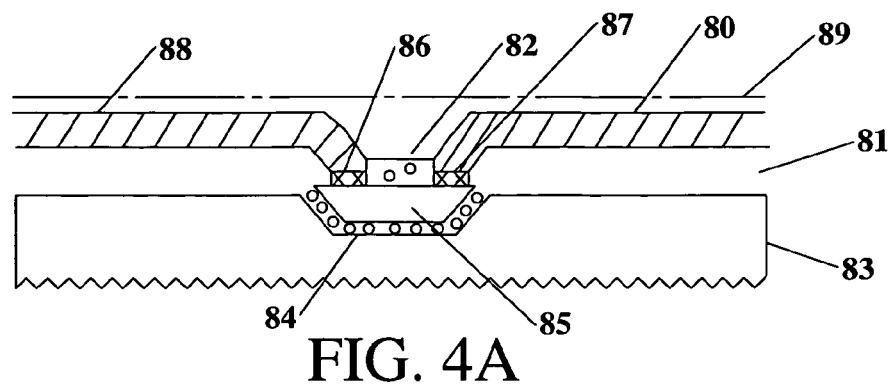
FIGS. 4A, 4B and 4C depict side views of printed electrical interconnects on luminescent thermally conductive elements for various LED die types of the present invention.

FIG. 4A depicts at least one LED 85 embedded within thermally conductive luminescent element 83. Thermally conductive luminescent element 83 may be formed via press sintering of aluminum oxide as known in the art to form a translucent polycrystalline alumina TPA with depressions sufficiently deep enough to allow for LED 85 to be recessed. Luminescent coating 84 may be substantially only in the pocket formed in thermally conductive luminescent element 83 or may cover substantially all the surfaces of thermally conductive luminescent element 83. Alternately, single crystal, polycrystalline or amorphous phosphor, pieces, plates, rods and particles can be fused or bonded into or onto thermally conductive luminescent element 83. In this manner, the quantity of luminescent material can be minimized while maintaining high thermal conductivity for the thermally conductive luminescent element 81.

As an example, single crystal CeYAG pieces 1 mm×1 mm and 300 microns thick can be fusion bonded into 1.1 mm×1.1 mm×500 micron deep pockets formed into TPA press sintered plates and then fired at 1700 degrees C. in a vacuum for 10 hours such that the single crystal YAG pieces are optical and thermally fused into the bottom of the TPA pockets. LED 85 can then be bonded into the remaining depth of pocket and be used to excite the single crystal Ce:YAG pieces locally. The combined optical emission from LED 85 and the single crystal Ce:YAG pieces would be spread out and extracted by the sinter pressed TPA while still maintaining high thermal conductivity.

Alternately, luminescent powders in glass frits, polysiloxane, polysilazane, and other transparent binders can food luminescent coating 84. In particular, high temperature binders in luminescent coating 84 such as polysilazane with luminescent powders, flakes, rods, fibers and in combination both pre-cured and as a bonding agent can be positioned between thermally conductive luminescent element 83 and at least one LED 85.

Materials with high visible spectrum transmission, lower refractive index, high thermal conductivity, and low processing costs for net and final shape are preferred materials for thermally conductive luminescent element 83. These materials include, but are not limited to, TPA, Spinel, Quartz, Glass, ZnS, ZnSe, ZnO, MgO, AlON, ALN, BN, Diamond, and Cubic Zirconia. In particular, Spinel and TPA formed via press sintering are low cost of manufacture of net shape parts. The use of techniques used to form TPA parts as seen in transparent dental braces as known in the art with luminescent elements either as coatings or bonded elements can create thermally conductive luminescent element 83.

With LED 85 recessed into thermally conductive luminescent element 83, printing and lithographic methods can be used to electrically interconnect at least one LED 83 to outside power sources and/or other LEDs or devices. Unlike wirebonding, this approach creates a low profile method of interconnecting LEDs which eases assembly of multiple sticks and reduces costs.

In one example, LED 85 is bonded into a pocket formed via laser ablation in a 1 mm thick wafer of Spinel to form thermally conductive luminescent element 83. In this example the Spinel may or may not include luminescent elements or properties. The majority of the wavelength conversion instead occurs locally around LED 85 via luminescent coating 84 and/or additional luminescent coating 82. This minimizes the amount of luminescent material necessary yet still allows for a low thermal resistance to ambient for the luminescent materials. While only a single side is shown in FIG. 4, the light source may also be bonded to another light source, heatsink, another transparent/translucent thermally conductive element to further enhance cooling and optical distribution from LED 85 and any luminescent elements within the light source. LED 85 is bonded into the pocket using polysilazane containing 0.1% to 2% doped Ce:YAG powder with a particle size below 10 microns.

Transparent/translucent dielectric layer 81 is inkjet printed over at least one LED 85 except contact pads 87 and 86. In the case where LED 85 uses TCO based contacts, at least a portion of the TCO is not covered by transparent/translucent dielectric 81 to allow for electrical contact. Optionally an additional luminescent coating 82 may be printed or formed on at least one LED 85 to allow for additional wavelength conversion and to create a more uniform spectral distribution from the device. Interconnects 80 and 88 may then be applied either before or after curing of transparent/translucent dielectric 81. Polysilazane, polysiloxane, glass frit, spin-on glasses, and organic coatings are examples of transparent/translucent dielectric 81, preferably the coatings can maintain transparency above 300 degrees C. Formulations containing Polysilazane with and without luminescent elements are preferred materials for additional luminescent coating 82, transparent/translucent dielectric 82 and luminescent coating 84. Preferred luminescent elements are powder phosphors, quantum dots, fluorescent dyes (example wavelength shifting dyes from Eljen Technologies) and luminescent flakes and fibers.

Electrical connection to LED 85 is via interconnects 80 and 88 for lateral LED designs. Precision inkjet printing of silver conductive inks and/or screen printing of thick film silver inks form interconnects 80 and 88. As an example thick film silver paste is screen printed and fired onto thermally conductive luminescent element 83 up to the pocket for LED 85. Transparent/translucent dielectric 81 is inkjet printed such that only contacts 87 and 86 are left exposed and the transparent/translucent dielectric 81 covers the rest of the exposed surface of LED 85 and at least a portion of thermally conductive luminescent element 83 in a manner to prevent shorting out LED 85 but still allowing access to the thick film silver paste conductors applied earlier. After or before curing of transparent/translucent dielectric 81 and optionally additional luminescent coating 82, conductive ink is inkjet printed connecting the thick film silver conductor applied previously to the contacts 86 and 87. Using this approach, alignment issues can be overcome due to the availability of inkjet systems with image recognition and alignment features while still allowing for low resistance conductors. In general, while inkjet printing of conductors can be very accurate and be printed with line widths under 50 microns, the thickness is typically limited to under 10 microns which limits the current carry capacity of long lines. Using this approach, thick film silver conductors which can be over 50 microns thick can be used to carry the majority of the current and then short inkjet printed traces can be used to stitch connect between the thick film silver conductors and contacts 87 and 86. Using this approach, gold wire bonding can be eliminated.

A transparent/translucent overcoat 89 may be applied over at least a portion of interconnects 80 and 89 and/or transparent/translucent dielectric 81, additional luminescent coating 82, and thermally conductive luminescent element 83 to environmentally and/or electrically isolate the device. Protective barrier layers on LED die 85 can be formed during LED fabrication to facilitate or even eliminate the need for transparent/translucent dielectric layer 81 and allow for direct printing of interconnect 89 and 88 onto contacts 87 and 86 respectively. Catalytic inks and/or immersion plating techniques allow for the formation of thicker/lower resistivity traces for interconnect 89 and 88, eliminate the need for thick film printing and allow for the use of inkjet printing for the entire interconnect. Preferred materials for transparent/translucent overcoat 89 include but are not limited to polysilazane, polysiloxane, spin-on glasses, organics, glass frits, and flame, plasma, HVOF coatings. Planarization techniques based on spin-on glasses and/or CMP can be used for transparent/translucent overcoat 89. Luminescent elements including but not limited to powders, flakes, fibers, and quantum dots can be incorporated in transparent/translucent overcoat 89, transparent/translucent dielectric 81, and additional luminescent coating 82. Luminescent elements may be spatially or uniformly dispersed in these layers.

Figure 4B:
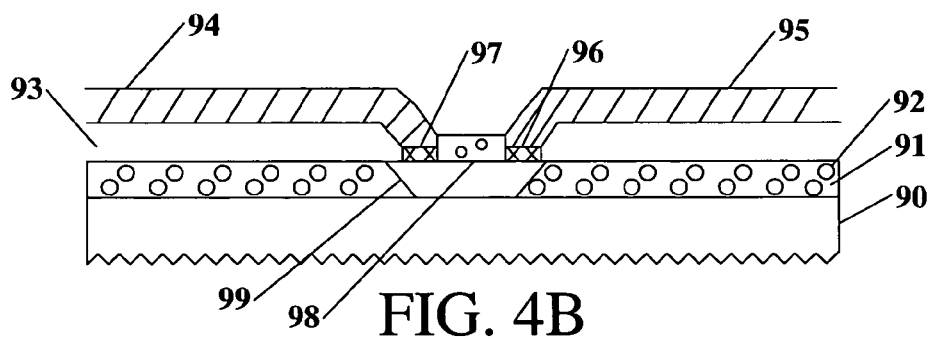

FIG. 4B depicts a light source in which a luminescent layer 91 is formed on a transparent/translucent element 90 containing extraction elements. Transparent/translucent element 90 can be, but is not limited to, single crystalline materials such as sapphire, cubic zirconia, YAG (doped and undoped), ZnO, TAG (doped and undoped), quartz, GGG (doped and undoped), GaN (doped and undoped), AlN, oxynitrides (doped and undoped), orthosilicates (doped and undoped), ZnS (doped and undoped), ZnSe (doped and undoped), and YAGG (doped and undoped), polycrystalline materials, and amorphous materials such as glass, ceramic YAG (doped and undoped), ALON, Spinel, and TPA. In general, single crystal materials grown via verneuil, EFG, HEM, Czochralski, CVD, hydrothermal, skull, and epitaxial means can be the transparent/translucent element 90.

Luminescent layer 91 may be formed directly one transparent/translucent element 90 or be formed separately and then bonded to transparent/translucent element 90. Flame-spraying, plasma spraying, and HVOF techniques can form either or both luminescent layer 91 and transparent/translucent element 90. The light source can have a transparent/translucent element 90 with an alpha less than 10 cm-1 throughout the visible spectrum and a luminescent layer 91 containing at least one luminescent element emitting between 400 nm and 1200 nm. The luminescent layer 91 can exhibit a refractive index which is not more than 0.2 different than transparent/translucent element 90. LED 99 may be InGaN, AlInGaP, ZnO, BN, Diamond, or combinations of InGaN, AlInGaP, ZnO, BN, or diamond.

Both InGaN and AlInGaP LEDs can be used for LED 99 combined with a transparent/translucent element 90 consisting of at least one of the following materials; sapphire, spinel, quartz, cubic zirconia, ALON, YAG, GGG, TPA, or ZnO and luminescent layer 91 and/or additional luminescent layer 98 containing Ce doped YAG. An additional red phosphor emitting between 585 and 680 nm can be used within luminescent layer 91 and/or additional luminescent layer 98. These elements form a self cooling light source which emits an average color temperature between 6500K and 1200K that lies substantially on the black body curve is a preferred embodiment of this invention. The self cooling light source can emit an average color temperature between 4000K and 2000K than lies substantially on the blackbody curve.

Multiple self cooling light sources can be used within a fixture, reflector, optic or luminaire such that color and intensity variations are averaged out in the far field. Three or more self cooling light sources within a fixture, reflector, optic or luminaire creates a uniform illumination at a distance greater than 6 inches from the sources. Transparent/translucent dielectric layer 93 may be inkjet printed, silk screen printed, formed via lithographic means and exhibits an alpha less than 10 cm-1 throughout the visible spectrum. Interconnect 95 and 94 may be printed using inkjet, silkscreen, template, or lithographic means. Catalytic inks and immersion plating techniques increase conductor thickness and thereby reduce resistivity. Silver traces with a trace width less than 500 microns and a reflectivity greater than 50% for interconnect 95 and 94 reduce absorption of the light generated within the light source. Contacts 96 and 97 on LED 99 may be on one side only as in lateral devices or consist of one top contact and one side contact as previously disclosed in US Patent Application 20060284190, commonly assigned and herein incorporated by reference.

Figure 4C:
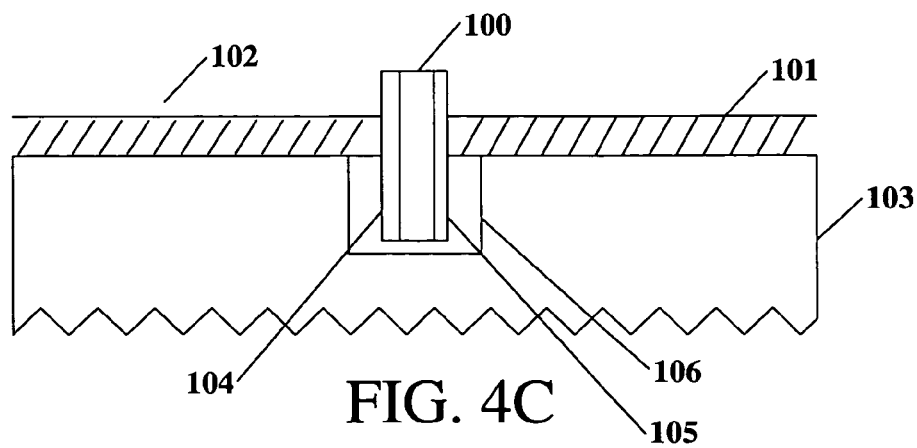

FIG. 4C depicts a self-cooling light source with at least one vertical LED 100 mounted to or at least partially embedded in thermally conductive luminescent element 103. Composite, layer, single crystal, polycrystalline, amorphous, and combinations as described previously can be used for the thermally conductive luminescent element 103. In this particular example, one vertical LED 100 is mounted such that interconnect 101 and 102 may be printed via inkjet, silkscreening, or lithographic means directly on thermally conductive luminescent element 103 and in contact with a side of vertical LED 100. This embodiment eliminates the need for an additional dielectric and allows for the use of vertical LED devices which inherently exhibit lower Vf than lateral devices. A substrate free LED as described in US patent application 20090140279 (commonly assigned and incorporated herein by reference) is a preferred embodiment for LED 100. Direct die attach and flip chip mounting configurations may also be used for LED 100. For the substrate free case, InGaN and/or AlInGaP vertical LED 100 has TCO contacts 104 and 105 for LED 100 wherein the interconnects 101 and 102 are thick film silver inks which form ohmic contact to the adjacent TCO contact 104 and 105. In this manner, absorption losses are minimized and the need for lithographic steps to fabricate LED 100 is eliminated or minimized. A self cooling light source contains at least one vertical LED 100 with TCO contacts 104 and 105 connected via thick film silver traces for interconnect 101 and 102 directly bonded to TCO contacts 104 and 105 on a thermally conductive luminescent element 103. Optionally, bonding layer 106 may be used to mount, improve extraction, incorporate additional luminescent materials or position LED 100 onto or within thermally conductive luminescent element 103.

FIG. 5 depicts various shapes of thermally conductive luminescent elements. FIG. 5A depicts a substantially flat luminescent element 107. Thickness is a function of dopant concentration but typically the thickness ranges from 200 micron to 2 mm for a uniformly doped Ce doped YAG with a Cerium doping concentration between 0.02% and 10%. In order for efficient thermal spreading to occur, the thermal conductivity of the thermally conductive luminescent element 107 needs to be greater than 1 W/m/K to adequately handle average power densities greater than 0.1 W/cm2 of surface area on luminescent element 107. If the thermal conductivity is to low there is insufficient thermal spreading of the heat generated within the device which decreases the ability of the flat luminescent element 107 to cool itself via natural convection and radiative means.

Figure 5A:
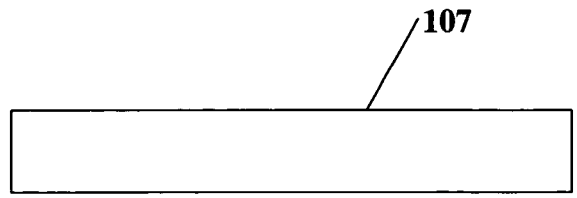
FIGS. 5A, 5B, 5C and 5D depict side views of various shapes of wavelength conversion elements of the present invention.
Figure 5B:
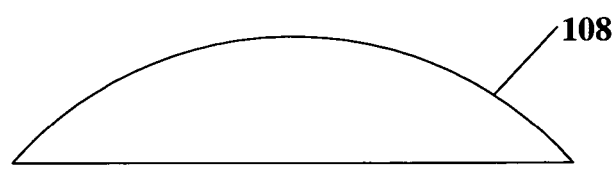

FIG. 5B depicts a non-flat (hemispheric) luminescent element 108. In this case, light extraction can be enhanced for those rays which are waveguiding within the higher refractive index of non-flat luminescent element 108. In addition, far field intensity and wavelength distributions can be modified. Multiple smaller self cooling light sources with the same or different shaped thermally conductive luminescent elements create uniform or specific far field intensity and wavelength distributions. The extraction of light generated within a medium with a refractive index greater than air is restricted by total internal reflection per Snell's Law. Shaped luminescent elements 108 can be used to reduce the average optical path length of optical rays required to escape the luminescent element 108. Since absorption losses are directly proportional to the optical path length for a given absorption coefficient (alpha), reducing the average optical path length directly translates into reduced absorption losses. The spatial location of where the optical rays are generated within luminescent element 108, the refractive index of luminescent element 108, absorption coefficient (alpha) of luminescent element 108, bulk and surface scattering within and on luminescent element 108, and the geometry of luminescent element 108 can all be modeled as known in the art to optimize the extraction efficiency.

Figure 5C:
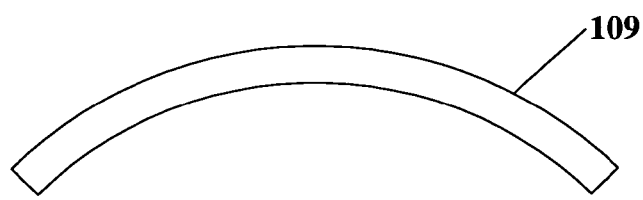

FIG. 5C depicts a non-flat (curved) thermally conductive luminescent element 109 with a substantially uniform thickness. In this manner extraction can be enhanced by maintaining a uniform thickness of luminescent material. Extrusion, pressing, molding, sawing, boring, and flame spraying techniques as known in the art may be used to fabricate various shapes of thermally conductive luminescent elements.

Figure 5D:
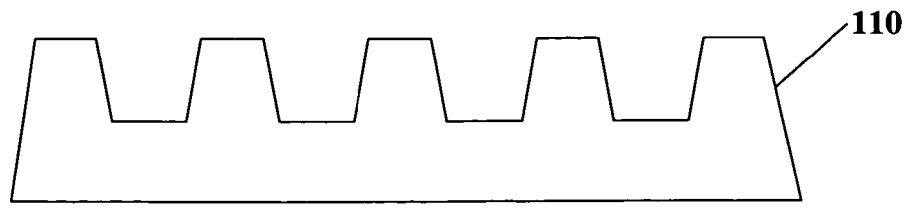

FIG. 5D depicts a non-flat (rectangular saw tooth) thermally conductive luminescent element 110 with additional surface elements to enhance convection cooling and optionally to modify or homogenize the emission output of the self-cooling light source. Extrusion, pressing, and molding techniques may be used to form thermally conductive luminescent element 110.

Figure 6A:
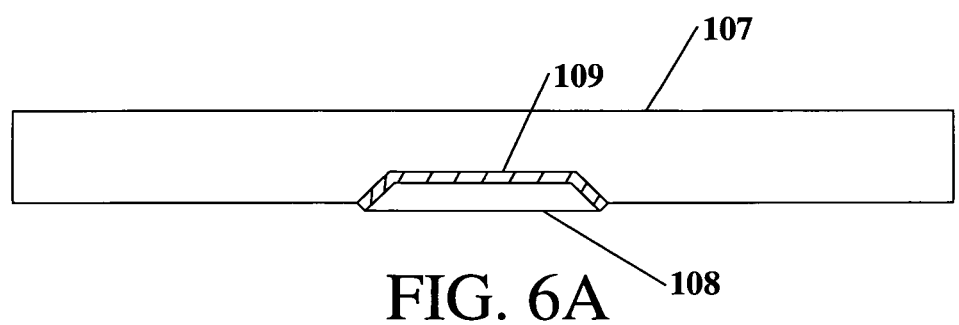
FIGS. 6A and 6B depict a side view of two different mountings for LEDs on wavelength conversion elements of the present invention.

FIG. 6A depicts a partially embedded LED 108 within a depression in thermally conductive luminescent element 107 mounted via bonding layer 109. The formation of the depression may be by laser machining, ebeam machining, etching (both chemical and mechanical), plasma etching, molding, and machining means. Substrate-free LEDs may be used for partially embedded LED 108 with a thickness less than 300 microns. By embedding partially embedded LED 108 in thermally conductive wavelength conversion element 107, the thermal resistance between the two elements can be reduced which lowers the junction temperature of the LED for a given drive level. Optionally, more of the emission from partially embedded LED into thermally conductive luminescent element 107 can be coupled thereby changing the color temperature of the self cooling light source.

Figure 6B:
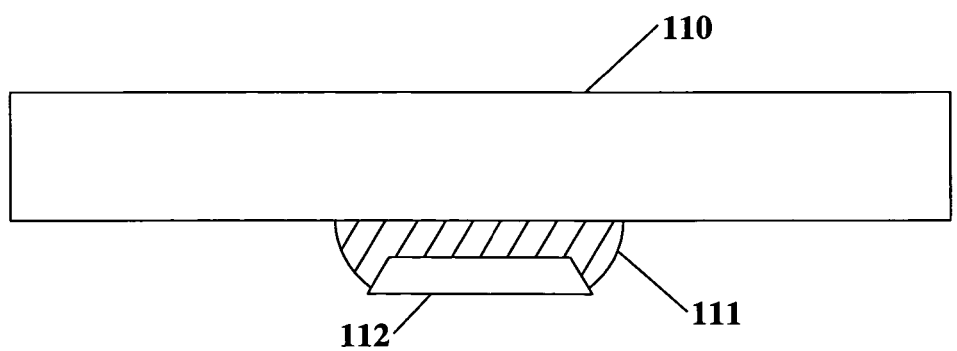

FIG. 6B depicts at least one LED 112 bonded onto thermally conductive luminescent element 110 via bonding layer 111. In this case, bonding layer 111 should exhibit a thermal conductivity greater than 1 W/m/K and an alpha less than 10 cm-1 for the emission wavelengths of LED 112.

Figure 7A:
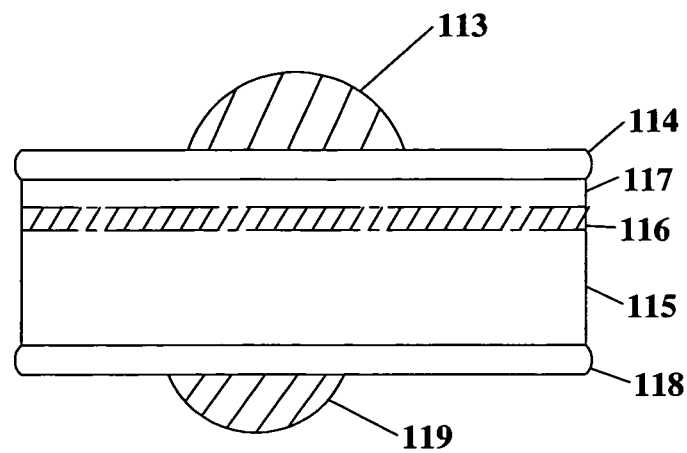
FIGS. 7A, 7B and 7C depict side views of printed interconnects on LED die of the present invention.

FIG. 7 depicts various printed contacts for TCO contact based LEDs. FIG. 7A depicts a vertical LED consisting of a top silver paste contact 113 on TCO layer 114 on p layer 117. Active region 116 is between p layer 117 and n layer 115 with n layer 115 covered with TCO contact 118 and bottom silver paste contact 119. A substrate free LED allows dual sided growth of TCO contact layers 114 and 118 on substrate free LED structures consisting of p layer 117, active layer 116 and n layer 115. Thick film high temperature silver paste contacts 113 and 119 can be printed on LEDs with TCO contacts 114 and 118 and fired at temperatures greater than 200 degrees C. in various atmospheres to form a low optical absorption, low Vf, and substantially lithography free LED devices.

Figure 7B:
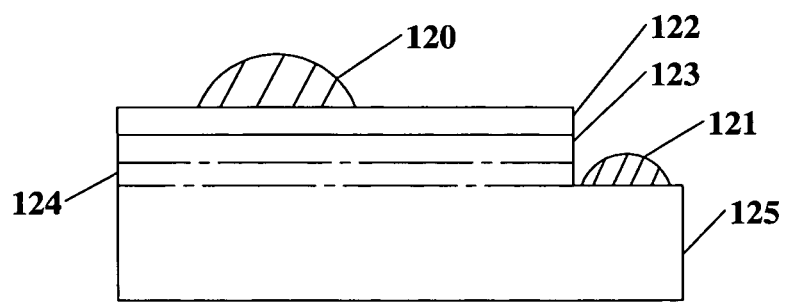

FIG. 7B depicts a lateral device with printed/inkjet printed contacts 120 and 125. In all cases, ohmic contact to the n layer may include or not include an intermediary TCO layer to form reasonable ohmic contact. In FIG. 7B, TCO 122 is grown on p layer 123. Active layer 124 is between p layer 123 and n layer 125. TCO 122 is doped ZnO grown via CVD with a resistivity less than 0.003 ohm-cm and greater than 1000 Angstroms thick. Printed etch masks allow for etch of the step down to n layer 125. As an example, an AlInGaP LED epi may be grown on GaAs. The wafer can be etched and patterned to form the lateral device having TCO 122 on the p layer 123. Printed contacts 120 and 125 are formed on TCO 122 and n layer 125. Optionally an additional TCO layer maybe formed of n layer 125 to further reduce Vf. The addition of a eutectic solder layer to printed contact 120 and 125 to create a direct die attach die is also disclosed. In a preferred embodiment, the AlInGaP epi is removed via chemical etching using a sacrificial etching layer between the AlInGaP and GaAs substrate as known in the art. The resulting direct attach die may be additionally wafer bonded to GaN substrates as disclosed in U.S. Pat. Nos. 7,592,637, 7,727,790, 8,017,415, 8,158,983, and 8,163,582, and US Patent Applications Publication Nos. 20090140279 and 20100038656, commonly assigned as the present application and herein incorporated by reference.

Figure 7C:
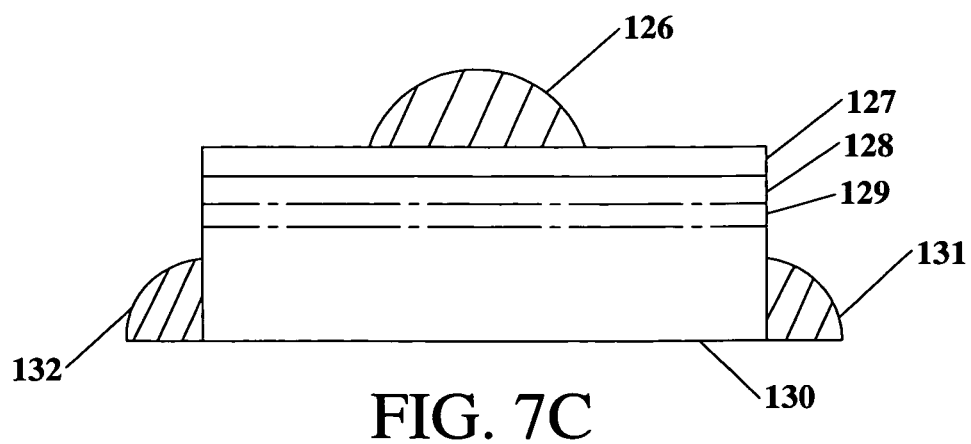

FIG. 7C depicts a printed contact with a top contact 126 and side contacts 132 and 130. Again TCO 127 forms a low ohmic transparent ohmic contact to p layer 128 and the active region 129 is between p layer 128 and n layer 130. Side contacts 131 and 132 contact the side walls of n layer 130. N layer 130 is greater than 10 microns of thickness. Even more preferably, the thickness of n layer 130 is greater than 50 microns but less than 250 microns.

FIG. 8 depicts various methods of changing the far field distribution of single self cooling source. In FIG. 8A, the refractive indices, geometry, and spacing of the LEDs 136, the wavelength conversion elements 133 and 135, and the bonding material 137 will determine the far field distribution of the source. The far field distribution is determined by where the optical rays exit, how much of the optical rays, the direction of the optical rays and the spectrum of optical rays that exit a particular spatial point on the single self cooling source. FIG. 8 illustrates various reflectors, scattering elements, and diffusers which modify where, how much, which way and the spectrum of the light rays emitted from the source. One or more wavelength conversion elements for mounting LEDs 136 can be used although two wavelength conversion elements 133 and 135 are depicted. Multiple LEDs 136 can be mounted on one or more surface of the one wavelength conversion element 133. Based on these parameters, radiation will be emitted from the structure or light guided within the source. Additionally, edge element 134 may also modify the far field distribution out of the device. Edge element 134 and bonding materials 137 may be translucent, transparent, opaque, and/or luminescent. Luminescent powders within a transparent matrix for edge element 134 and bonding materials 137 can modify the emission spectrum as well as the far field intensity distribution.

Figure 8A:
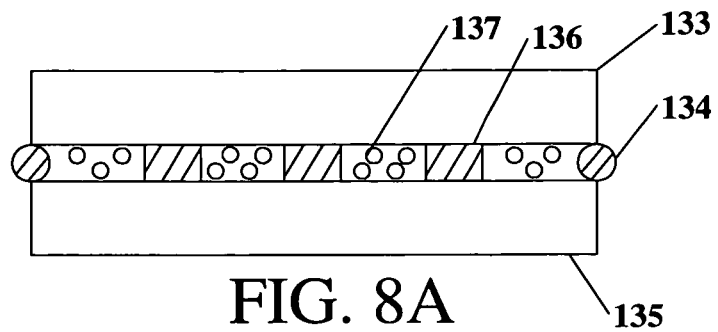
FIGS. 8A, 8B, 8C and 8D depict side views of various environmental seals for self cooling light sources of the present invention.
Figure 8B:
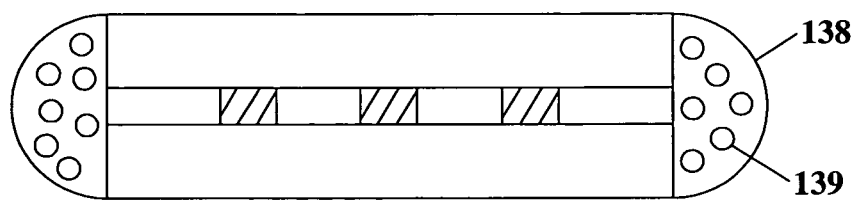

FIG. 8B depicts a self cooling light source where the entire end of the self cooling light source is substantially covered with a scattering element 139 within a matrix 138. Additionally, scattering element 139 and matrix 138 may extend to encompass not only edges of the self cooling light source but also a substantial portions of the other surfaces of the self cooling light source. In this manner, light emitted from all the surface of the self cooling light source can be redirected to modify the far field intensity distribution. Luminescent materials for scattering element 139 are excited by at least a portion of the spectrum emitted by the self cooling light source.

Figure 8C:
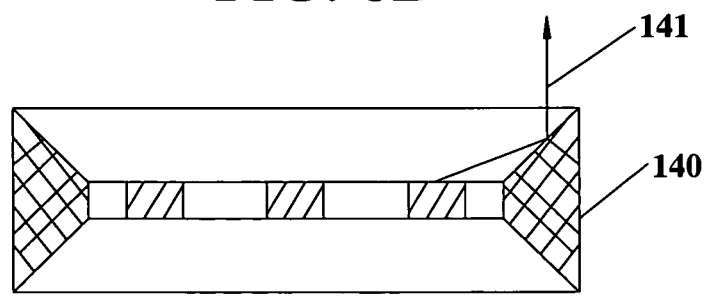

FIG. 8C depicts edge turning element 140 consisting of metal, diffuse scatterer, dielectric mirror, and/or translucent material whereby at least a portion of the light generated within the LED or wavelength conversion elements are redirected as depicted in ray 141.

Figure 8D:
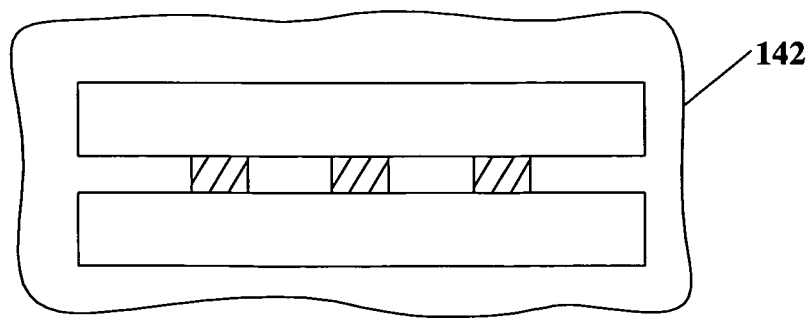

FIG. 8D depicts an outer coating 142 which may be translucent, partially opaque, polarized, and/or luminescent. The far field intensity, polarization, and wavelength distribution can be modified both in the near field and far field and spatial information can be imparted onto the self cooling light source. As an example, a self cooling light source with a shape similar to a candle flame may have a spectrally variable outer coating 142 such that red wavelengths are emitted more readily near the tip of the candle flame and blue wavelengths are emitted more readily near the base of the candle flame. In this fashion, the spatially spectral characteristics of a candle flame could be more closely matched. Using this technique a wide range of decorative light sources can be formed without the need for additional optical elements.

In another example, outer coating 142 may consist of a reflective coating such as aluminum into which openings are etched or mechanically formed. More specifically, sunlight readable indicator lights can be formed using this technique as warning, emergency, or cautionary indicators. The use of circular polarizers within outer coating 142 can enhance sunlight readability. Alternately, outer coating 142 could be patterned to depict a pedestrian crossing symbol that could be either direct viewed or viewed through an external optic thereby creating a ultra compact warning sign for crosswalks and other traffic related applications. In another example, outer coating 142 may consist of spectrally selective emissivity coating such that the emissivity of the self cooling light source is enhanced for wavelengths longer than 700 nm. By enhancing the infrared and far infrared emissivity of the self cooling light source more efficient light sources can be realized. As stated in the previous example of FIG. 3 the radiation cooling represents a significant percentage of the cooling in self cooling light sources. It is preferred that high emissivity coatings be used for outer coating 142 to maximize cooling from the surface of the self cooling light source. Most preferred is an outer coating 142 with an emissivity greater than 0.5. Depending on the maximum surface temperature the radiative cooling can represent between 20% and 50% of the heat dissipation of the source.

Figure 9A:
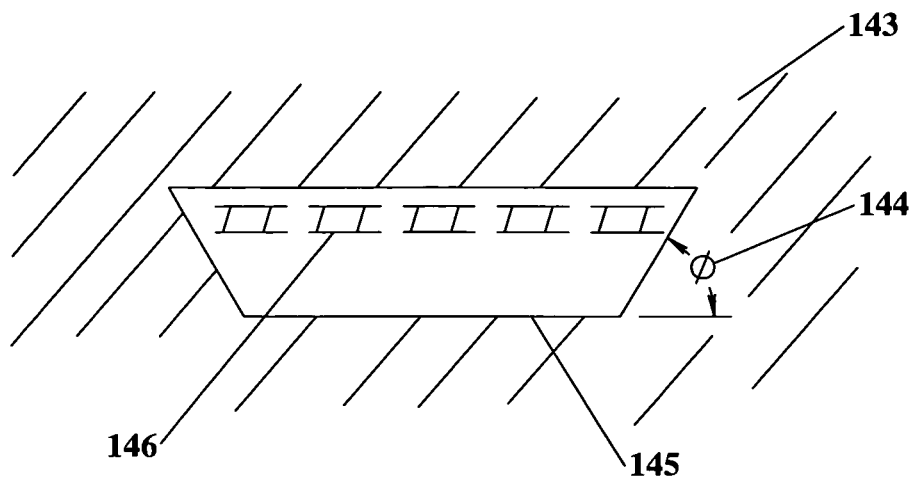
FIGS. 9A and 9B depict side views of die shaping for enhanced dual sided extraction of the present invention.

FIG. 9A depicts the use of die shaping of optical devices within a media 143. As an example, LED 145 contains an active region 146 embedded within media 143. Using ray tracing techniques known in the art, there is an optimum angle 144 to maximize the amount of radiation transferred into media 143. Typically, semiconductor materials exhibit high refractive index which tends to lead to light trapping within the LED 145. In FIG. 9A the optimum angle 144 subtends the active region 146 as shown in the figure.

Figure 9B:
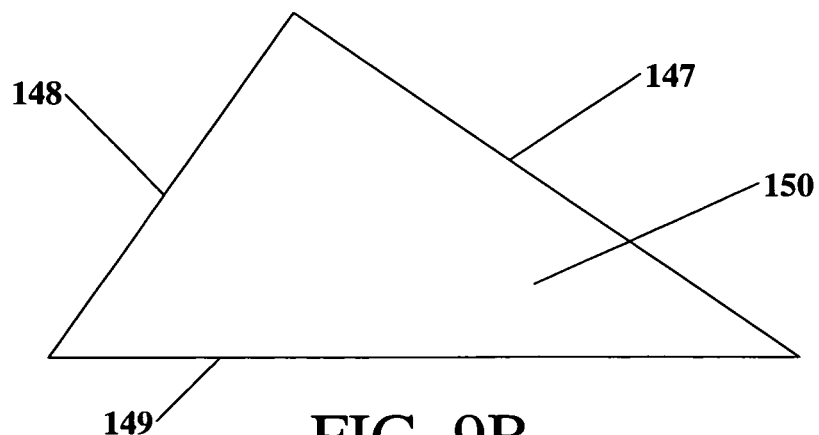

Alternately, FIG. 9B depicts that surfaces 149, 148 and 147 may be non-orthogonal forming a non square or rectangular die. In both these cases, light trapped within the LED 150 can more efficiently escape the die. The use of both forms of die shaping together is preferred. The use of non-rectangular shapes for LED 150 embedded within a wavelength conversion element to enhance extraction efficiency is a preferred embodiment of this invention.

Figure 10A:
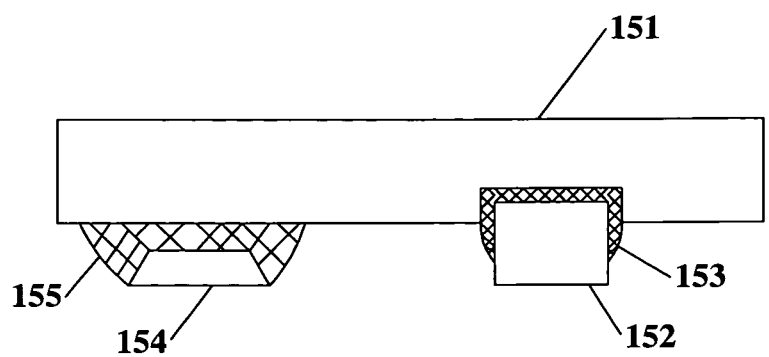
FIGS. 10A and 10B depict a side view and a graph of blue and red die in wavelength conversion elements of the present invention.

FIG. 10A depicts different mounting methods for LEDs 152 and 154 within wavelength conversion element 151 and the use of bonding layers 153 and 155. Bonding layers 153 and 155 thermally, optically, and mechanically attach LEDs 152 and 154 to at least one surface of wavelength conversion element 151. LED 152 is at least partially embedded within wavelength conversion element 151 which can allow for both edge and surface coupling of radiation emitted by the LED 152 into wavelength conversion element 151 using bonding layer 153. Alternately, LED 154 is substantially coupled to the surface of wavelength conversion element 151 using bonding layer 155. Bonding layers 55 and 153 may be eliminated where wavelength conversion element 151 is directly bondable to LEDs 154 and 152 using wafer boding, fusion bonding, or melt bonding.

Figure 10B:
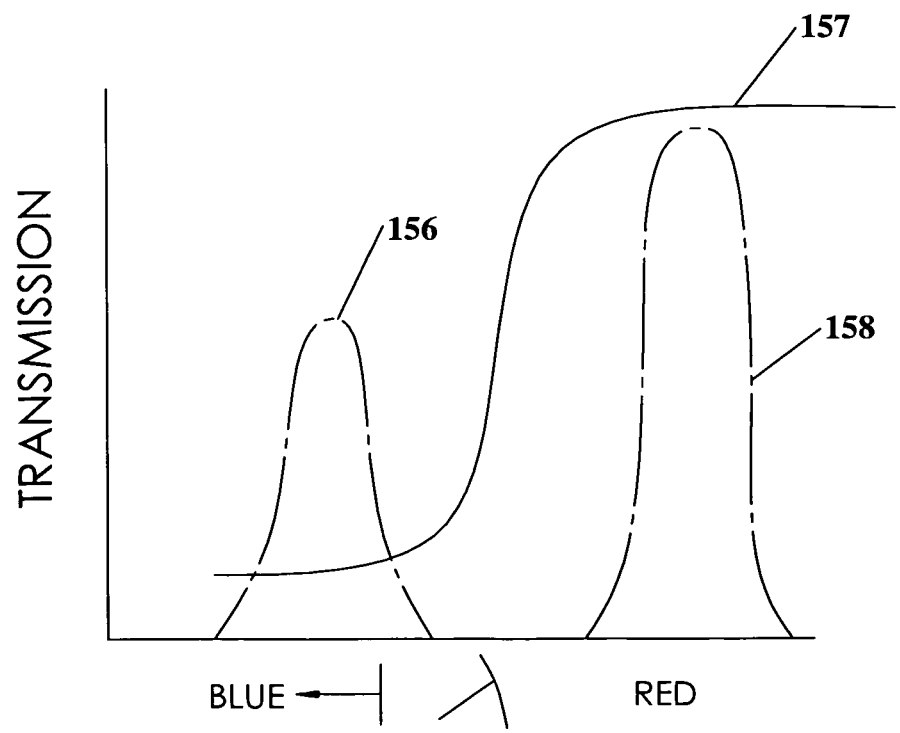

FIG. 10B depicts a typical transmission spectrum 157 of wavelength conversion elements. Blue emission 156 is absorbed by the wavelength conversion element and then reemitted at longer wavelengths. Red emission 158 is typically not strongly absorbed and therefore behaves as if the wavelength conversion element 151 is simply a waveguide. Virtually any color light source can be realized by properly selecting the right combination of blue and red LEDs within the wavelength conversion element 151. While wavelength conversion is a preferred embodiment, FIG. 10B illustrates that self-cooling light sources do not require that the wavelength conversion element 151 be luminescent. In the case of a red self-cooling light source, wavelength conversion element 151 may be used to optically distribute and thermally cool the LEDS without wavelength conversion. Alternately, UV responsive luminescent materials can be used for wavelength conversion element 162 with UV LEDs 164 or 165. The transmission spectrum 157 is shifted to shorter wavelength which allows for the formation of self cooling light sources which exhibit white body colors, as seen in fluorescent light sources. This wavelength shift however is offset by somewhat reduced efficiency due to larger stokes shift losses.

Figure 11:
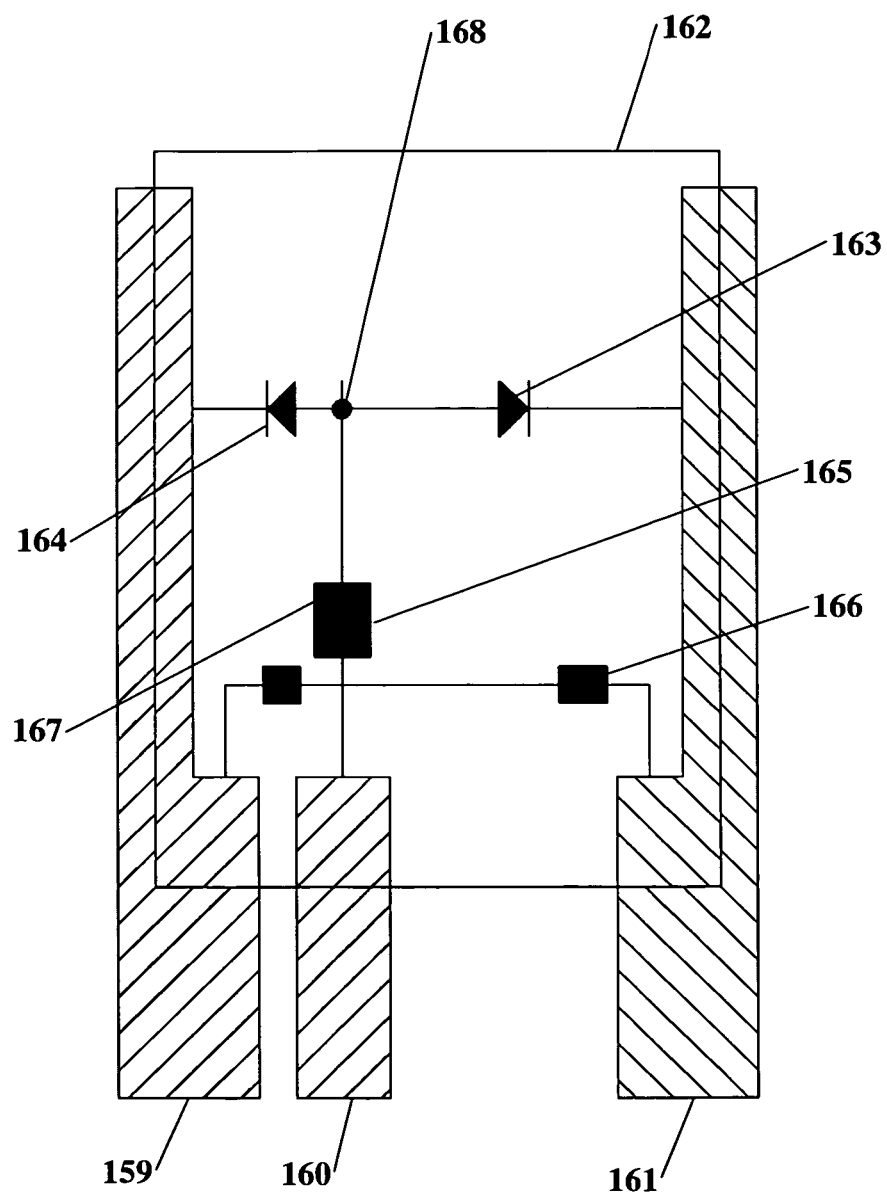
FIG. 11 depicts a top view of a three pin self cooling light source of the present invention.
Figure 12:
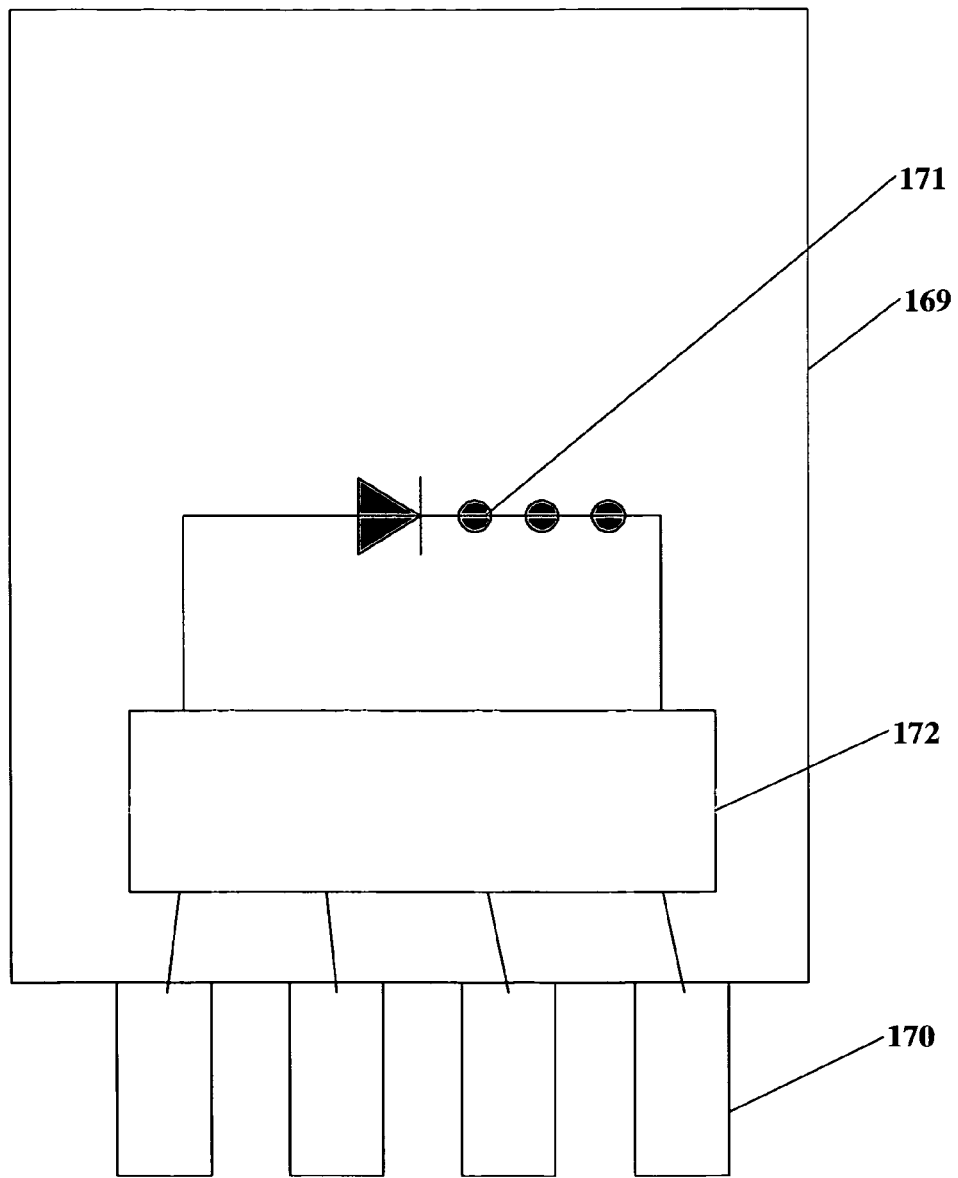
FIG. 12 depicts a top view of a self cooling light source with an integrated driver of the present invention.

FIG. 11 depicts a color tunable self-cooling light source containing at least one wavelength conversion element 162 with an electrical interconnect 168, at least one blue LED 164, at least one red LED 163, and drive electronics 165, 166, and 167. Electrical interconnect 168 is a thick film printed silver ink. Three separate pins 159, 160, and 161 to provide independent control of blue led 164 from red LED 163. Pins 159, 160, and 161 can be physically shaped to allow for keying thereby ensuring that the self-cooling light source is properly connected to external power sources. While pins 159, 160 and 161 are substantially shown on the same side of wavelength conversion element 162, the use of alternate pin configurations are anticipated by the inventors. In general, external electrical interconnect can be accomplished via pins 159, 160, and 161 as shown in FIG. 11 or via alternate interconnect means including, but not limited to, flex circuits, rigid elements containing electrical traces, coaxial wires, shielded and unshielded twisted pairs, and edge type connectors on or connected to wavelength conversion element 162 are embodiments of this invention. Additionally feedthroughs within wavelength conversion element 162 can be formed via mechanical, chemical etching, laser, waterjet, or other subtractive means to form external interconnects to any of the previous listed electrical interconnect elements in any plane of the wavelength conversion element 162. Drive electronics 165, 166, and 167 may consist of both active and passive elements ranging from resistors, caps, and inductors. In this manner, a variety of external drive inputs can be used to excite the light source. As an example, a current source chip may be mounted onto the wavelength conversion element 162 and connected to an external voltage source via pins 159,160, and 161. As known in the art, typical current source chips can also have an external resistor which sets the current which flows through the current source chip. The external resistor may be mounted on the wavelength conversion element 162 or be external to the source and connected to current source chip via pins 159, 160, and 161. As the functionality within the light source increases, the number pins may be increased. Integrated circuits can be used for drive electronics 165, 166, and/or 167. Wavelength conversion element 162 also substantially cools the drive electronics 165, 166, and 167 as well as LEDs 164 and 165. Pins 159, 160, and 161 may be used to remove heat from the heat generating elements of the light source. Wavelength conversion element 162 is luminescent and provides for optical diffusion and cooling of the heat generating elements within the self cooling light source In this case, additional wavelength emitters may be added including, but not limited to, UV, violet, cyan, green, yellow, orange, deep red, and infrared FIG. 12 depicts a self cooling light source with an embedded active driver 172 capable of driving multiple LEDs 171, all of which are mounted and cooled substantially by wavelength conversion element 169. Input pins 170 may provide power input to active driver 172 but also provide outputs including, but not limited to, light source temperature, ambient temperature, light output levels, motion detection, infrared communication links, and dimming controls. As previously disclosed, the transmission spectrum of the wavelength conversion element 169 allows for low absorption of longer wavelengths. An infrared/wireless emitter and receiver can be integrated into embedded active driver 172 so that the self cooling light source could also serve as a communication link for computers, TVs, wireless devices within a room, building, or outside. This integration eliminates the need for additional wiring and devices.

Figure 13A:
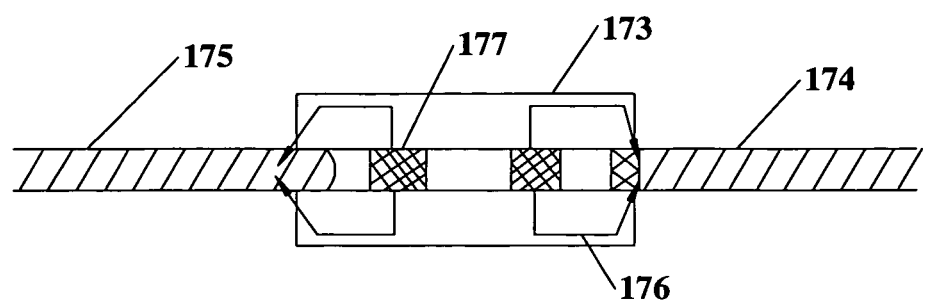
FIGS. 13A and 13B depict a side view and a perspective view of a self cooling light source with additional cooling means of the present invention.

FIG. 13A depicts the use of electrical contacts 174 and 175 as additional thermal conduction paths for extracting heat 178 out of the wavelength conversion elements 173 and 174 additionally cooling paths for LED 177. LED 177 may be direct attach or flip chip and may be a lateral, vertical, or edge contact die. As an example, electrical contact 174 and 175 may consist of 0.3 mm thick Tin plated aluminum plates sandwiched between wavelength conversion elements 173 and 174. In this manner both electrical input and additional cooling means for wavelength conversion elements 173 and 174 as well as LED 177 can be realized.

Figure 13B:
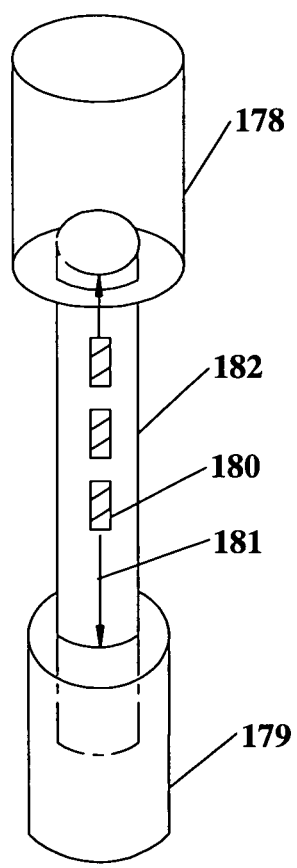

FIG. 13B depicts a rod based light source with LEDs 180 within rod shaped wavelength conversion element 182 wherein heat 181 is additionally extracted via conduction to contacts 178 and 179. Alternately, hemispherical, pyramidal, and other non-flat shapes and cross-sections maybe used for wavelength conversion element 182 to create a desired intensity, polarization, and wavelength distribution. Cross-section and other shapes, such as spheres and pyramids, maximize the surface area to volume ratio, so that convective and radiative cooling off the surface of the wavelength conversion element 182 is maximized while using the least amount of material possible. As an example, contacts 178 and 179 may consist of 2 mm copper heatpipes thermally bonded via a bonding method including but not limited to gluing, mechanical, soldering, or brazing means to wavelength conversion element 182. In this manner additional cooling maybe realized. LEDs 180 may be mounted on the surface or inside of wavelength conversion element 182. As an example LEDs 180 may be mounted on the flat surface of two hemispherical wavelength conversion elements 182. The two hemispherical wavelength conversion elements 182 are bonded together to form a spherical self cooling light source with the LEDs 180 embedded within the wavelength conversion elements 182. Alternately, the LEDs 180 may be mounted on the spherical surface of the hemispherical wavelength conversion element 182 such the light generated by LED 180 generally is coupled into the hemispherical wavelength conversion element 182. Optionally, the flat surface of hemispherical wavelength conversion 182 may have additional luminescent coatings such that the light emitted by LEDs 180 is effectively coupled by the hemispherical wavelength conversion element 182 onto the luminescent bonding layer which reflects, transmits, converts or otherwise emits both the light emitted by the LEDs 180 and any luminescent elements back out of the hemispherical wavelength conversion element 182. The advantage of this approach is that the LEDs 180 are mounted closer to the cooling surface of the wavelength conversion element, a high degree of mixing is possible, and the angular distribution of the source can be controlled by how well the bonding layer is index matched to the wavelength conversion element 182. Bonding two hemispherical wavelength conversion elements 182 together forms a spherical source with externally mounted LEDs 180.

Figure 14:
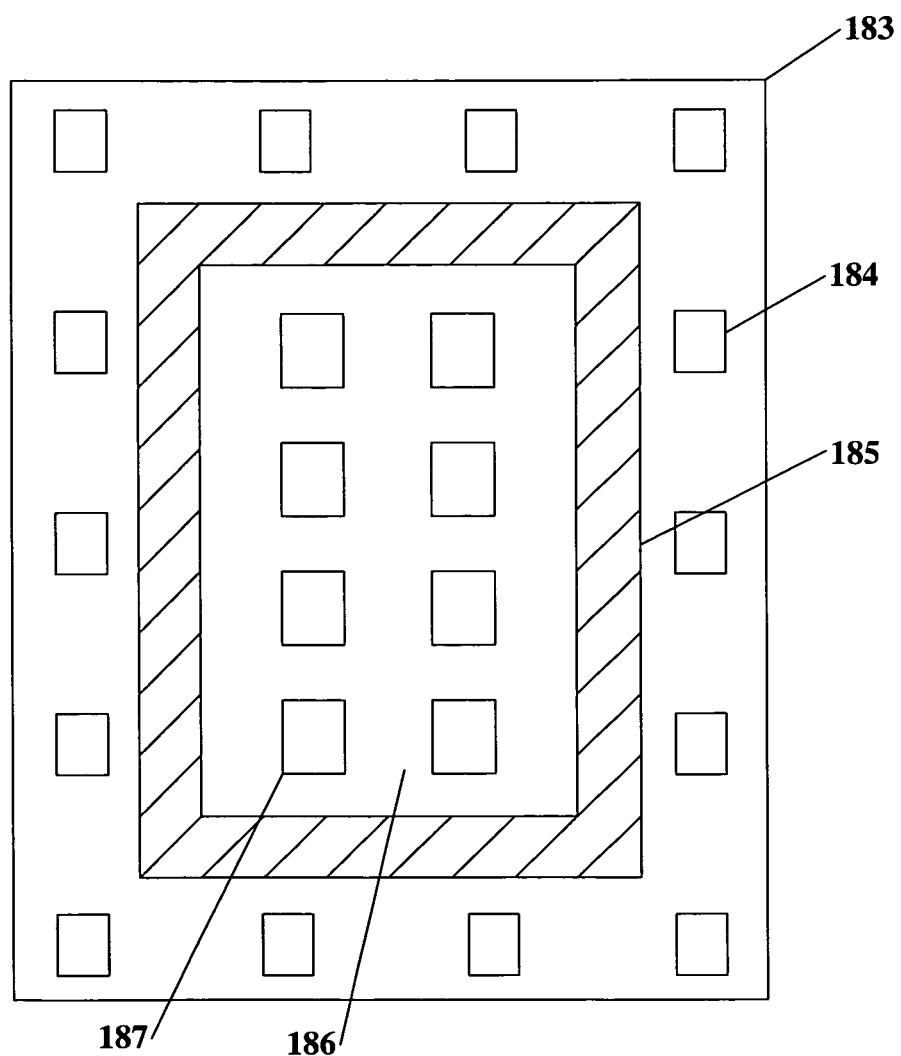
FIG. 14 depicts a top view of a self cooling light source with thermally isolated sections of the present invention.

FIG. 14 depicts a self cooling light source with at least two thermally and/or optically separated zones. Waveguide 183 containing LEDs 184 is optically and/or thermally isolated via barrier 185 from waveguide 186 and LEDs 187. Dual colored light sources can be formed. Alternately, temperature sensitive LEDs such as AlInGaP can be thermally isolated from more temperature stable InGaN LEDs. Waveguide 183 and 186 may or may not provide luminescent conversion. LED 184 are AlInGaP (red) LEDs mounted to waveguide 183 made out of sapphire. LEDs 187 are InGaN blue LEDs mounted onto waveguide 186 which is single crystal Ce:YAG. The barrier 185 is a low thermal conductivity alumina casting material. AlInGaP efficiency drops by 40% for junction temperatures over 60 degrees C. while InGaN efficiency will drop only by 10% for a similar junction temperature. White light sources can be realized by thermally isolating the AlInGap from the InGaN high overall efficiency. Using this approach the two sections operate at different surface temperatures. The InGaN LED 187 and waveguide 186 operates at a higher surface temperature while the AlInGaP LED 184 and waveguide 183 operates at a lower surface temperature.

Figure 15:
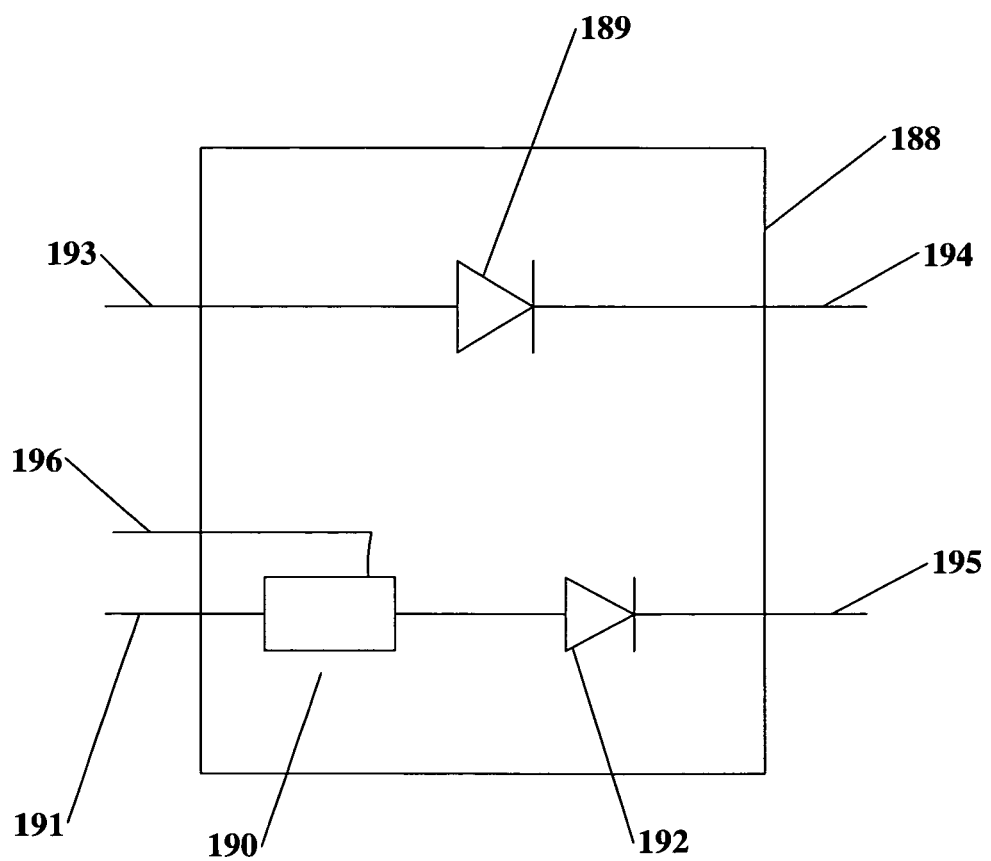
FIG. 15 depicts a top view of a self cooling light source with separate drive scheme for blue and red die of the present invention.

FIG. 15 depicts Blue LED 189 mounted to wavelength conversion element 188 and Red LED 192 with driver 190. Power lines 191, 193, 194, and 195 and control line 196 are also shown. Red LED 192 drive level is set via control line 196 by controlling the voltage/current flow available via power line input 191 and output 195. Typically driver 190 would be a constant current source or variable resistor controlled via control line 196. As stated earlier, blue LED 189 is typically InGaN with more stable regarding temperature, life and drive levels than red LED 192 typically AlInGaP. As an example, TPA coated with europium doped strontium thiogallate singularly or as a multiphase with another gallate, such as Eu doped magnesium gallat, e for wavelength conversion element 188 is excited by 450 nm LED 189. 615 nm AlInGaP red LED 192 is also mounted on the wavelength conversion element 188 along with driver 190. Heat is spread out via wavelength conversion element 188 as well as the radiation emitted by blue LED 189 and red LED 192. Control line 196 is used to adjust the color temperature of the source within a range by increasing the current to red LED 192 relative to the fixed output of blue LED 189. Additional LEDs and other emission wavelengths can be used.

Figure 16A:
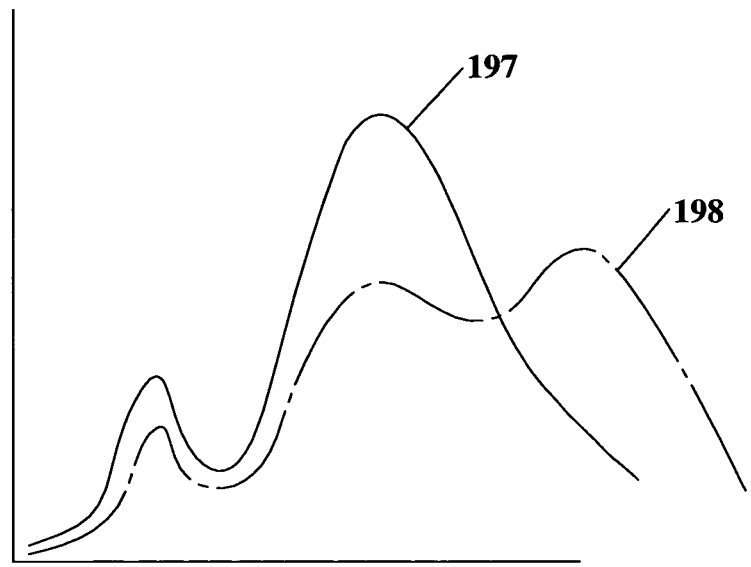
FIGS. 16A and 16B depict graphs of subtractive red phosphor and additive red LED of the present invention.

FIG. 16 depicts a white light spectrum for a typical solid state light source. FIG. 16A illustrates high color temperature low CRI spectrum 197 typically created by blue LEDS and Ce:YAG phosphors. Additional phosphors are typically added to add more red content in order to lower the color temperature as shown in spectrum 198. This red addition however requires that a portion of the blue and in some cases some of the green be absorbed which reduces overall efficiency.

Figure 16B:
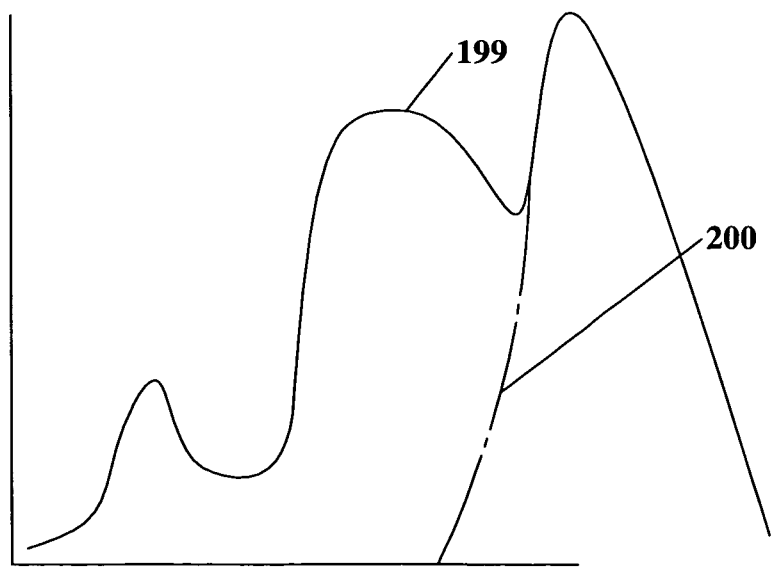

FIG. 16B depicts the typical spectrum 199 from a blue LED, Ce:YAG phosphor, and red LED. The red LED spectrum is additive as shown in spectrum 200. In general, both methods of FIG. 16 are used to form self-cooling light source described in this invention.

Figure 17:
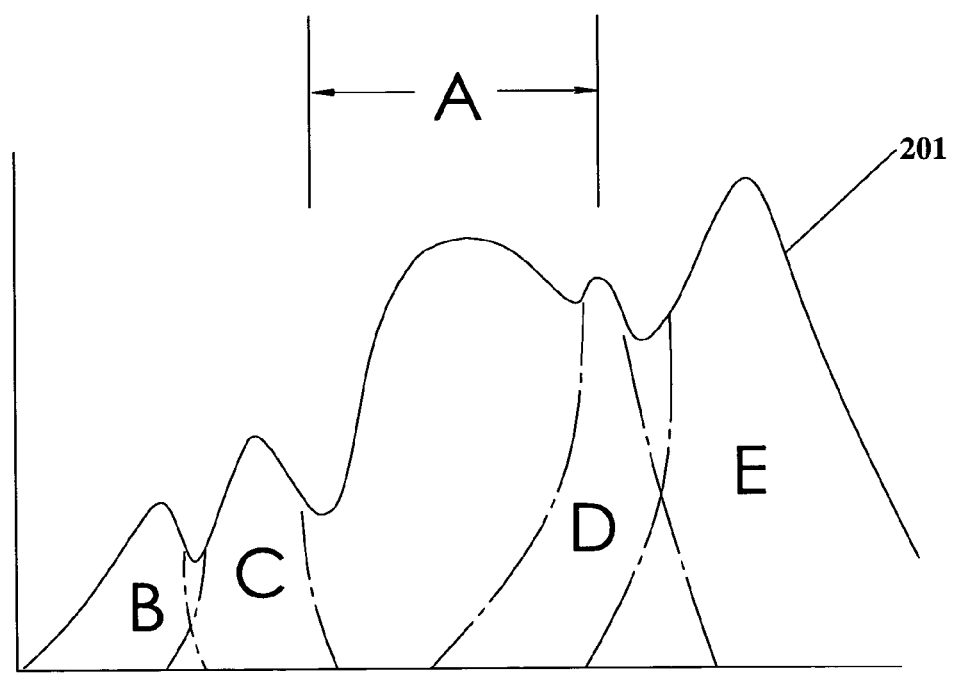
FIG. 17 depicts a graph of the spectrum from a self cooling light source with cyan and yellow LEDs of the present invention.

FIG. 17 depicts a high CRI white light spectrum 201 formed by mixing phosphor and LED spectrums A, B, C, D, and E. Spectral ranges can be mixed, diffused and converted within the wavelength conversion elements disclosed in this invention in addition to cooling, mechanically mounting, environmentally protecting, and electrically interconnecting the devices needed to generate the spectrums depicted. As an example, spectrum B may be derived from a blue 440 nm emitting LED, a portion whose output is used to excite a single crystal CeYAG luminescent element as previously disclosed to form spectrum A between 500 nm and 600 nm. Spectrum C may consist of a cyan quantum dot which also converts a portion of output of the blue 440 nm emitting LED into 490 to 500 nm wavelengths. Spectrum D maybe produced by using a wavelength shifter die such as Eljen-284 (Eljen Technologies Inc.) to convert a portion of Spectrum A into wavelengths between 580 nm and 700 nm and Spectrum E maybe a AlInGap red LED emitting between 600 and 800 nm. Infrared emitters or converters may also be add for communication links, security, and night vision applications.

Figure 18A:
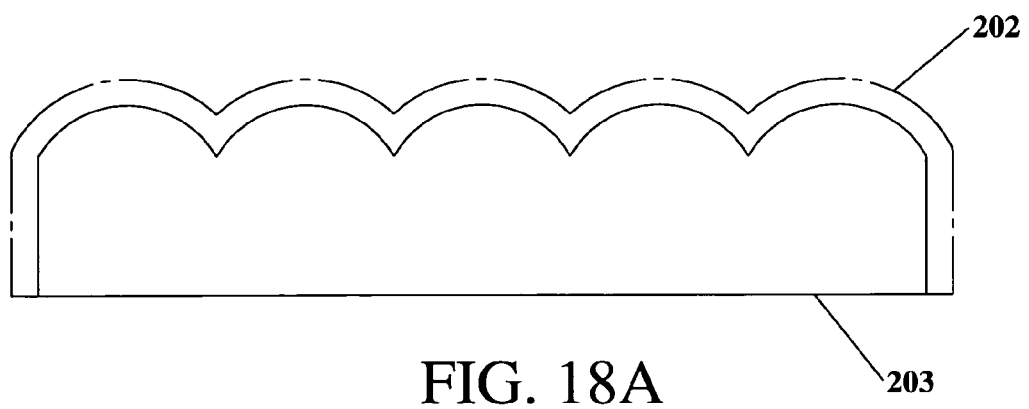
FIGS. 18A and 18B depict a side view and a perspective view of various shapes with luminescent coatings of the present invention.
Figure 18B:
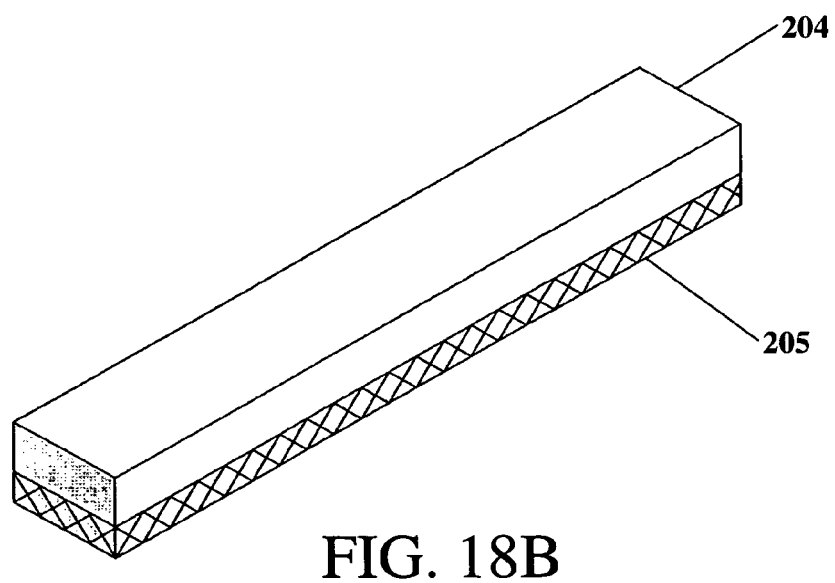

FIG. 18 depicts various shapes of waveguides and luminescent coatings. FIG. 18A depicts a textured thermally conductive waveguide 203 with a luminescent coating 202. As an example, a micro lens array maybe be press sintered out of TPA and coated with Ce:YAG via flame spraying. FIG. 18B depicts an EFG formed single crystal Ce:YAG rod 204 coated with a high emissivity coating 205 with a refractive index substantially equal to the geometric mean of Ce:YAG and air and a thickness greater than 300 angstroms. In the previous example of FIG. 3 the importance of radiative cooling even at low surface temperatures is disclosed. In this example the radiative cooling can represent up to 30% of the total heat dissipated as long as the emissivity of the surface is above 0.8. Emissivity varies from very low (0.01) for polished metals to very high 0.98 for carbon black surfaces. The use of high emissivity coatings 205 that are also transparent in the visible spectrum are most preferred. These include but not limited to silicates, glasses, organics, nitrides, oxynitrides, and oxides. Even more preferred are high emissivity coating 205 that also exhibit a thermal conductivity greater than 1 W/m/K. The high emissivity coating 205 thickness is preferably between 1000 angstroms and 5 microns thick. The emissivity coating 205 may also be luminescent.

Figure 19A:
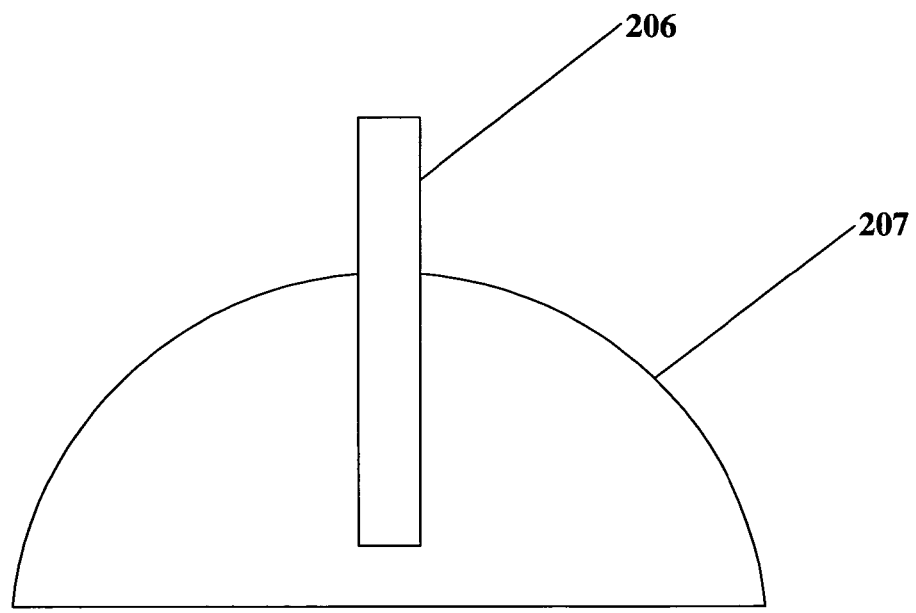
FIGS. 19A and 19B depict side views of optics for self cooling light source of the present invention.

FIG. 19A depicts a self cooling light source 206 and an optic 207. Optic 207 may be reflective, transparent, translucent or opaque. Both decorative and directional means may be used as an optic. Parabolic, elliptical, non-imaging and other optical configuration as known in the art may be used as an optic. In particular, the use of prismatic surface elements on optic 207 wherein a substantial portion of the light emitted by self cooling light source 206 are redirected in a direction orthogonal to their original direction are embodiments of this invention. Optic 207 redirects a portion of the light from light source 206 downward. The optic 207 may consist of, but is not limited to, glass, single crystal, polymer or other translucent/transparent materials. Colored translucent/transparent materials create a specific decorative or functional appearance. As an example a light source 206 may be embedded into an orange glass glob to form a decorative lamp. The elimination of the need for a heatsink greatly simplifies the optical design and allows for a wider range of reflectors and optical elements.

Figure 19B:
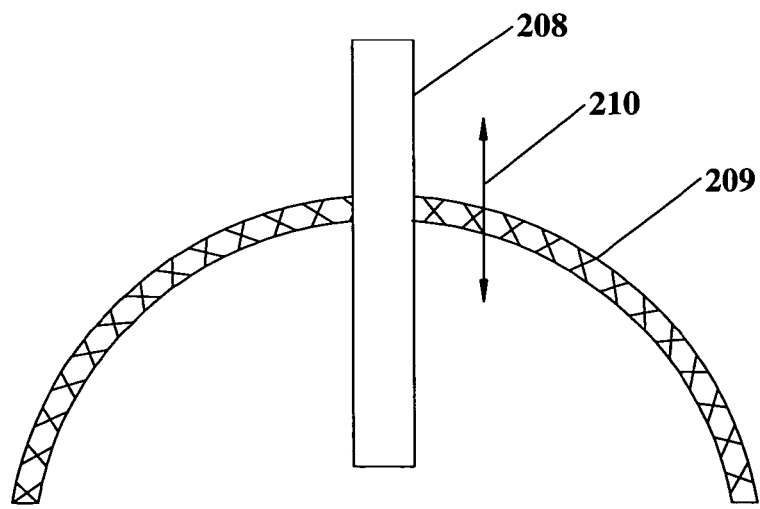

Alternately, FIG. 19B depicts an external movable reflector 209 which slides 210 up and down light source 208. Using this approach the percentage of downward light can be adjusted relative to the amount of diffuse lighting. Again the elimination of heatsinks and the formation of an extended source greatly simplifies the optical design of the light fixture.

Figure 20A:
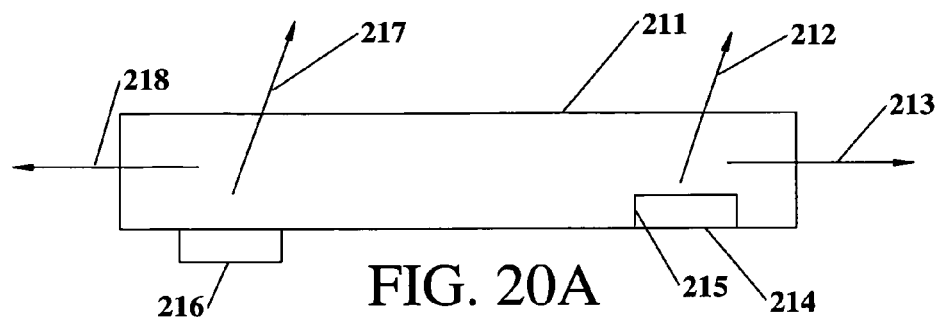
FIGS. 20A, 20B, and 20C depict side views of means of modifying the far field optical patterns of self cooling light sources of the present invention.

FIG. 20 depicts methods of adjusting the far field distributions of single light sources. In FIG. 20A, the far field distribution both intensity and wavelength can be adjusted by mounting methods for the LEDs 214 and 216 within or onto wavelength conversion element 211. LED 214 depicts an embedded LED 214 in which a pocket or depression is formed in wavelength conversion element 211. This embedded LED changes the ratio of transmitted rays 212 to waveguided rays 213 relative to surface mounted LED 216 which has a substantially different ratio of transmitted rays 217 to waveguided rays 218.

Figure 20B:
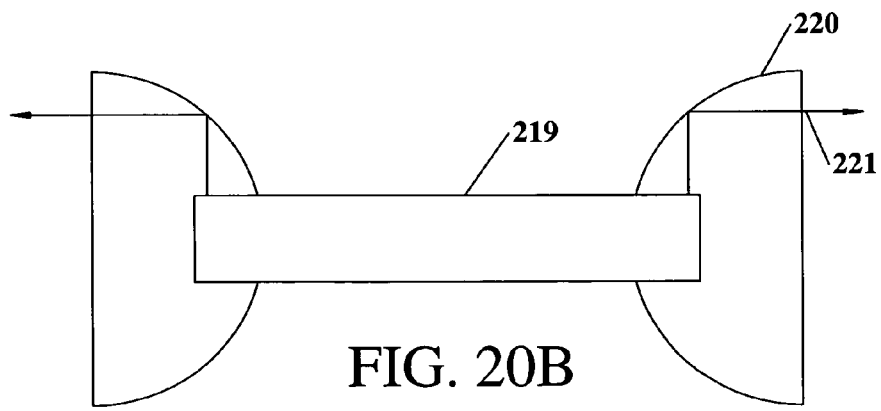

In FIG. 20B an optic 220 extracts light off of more than one surface of light source 219. In this case, rays 221 are redirected substantially orthogonally to the surface the rays were emitted from and mixed with the rays from other surfaces of light source 219. The optic 220 may be a prism, lens, parabolic, elliptical, aspherical, or free formed shape.

Figure 20C:
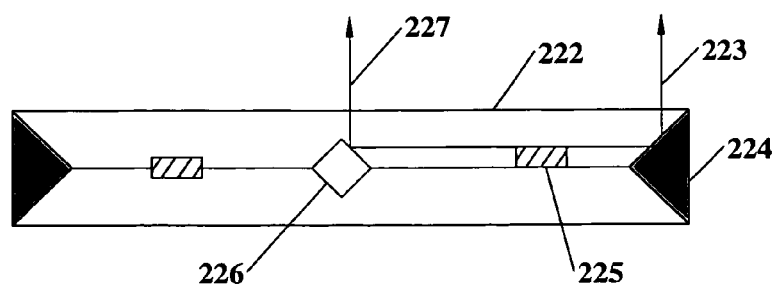

FIG. 20C depicts embedded LEDs 225 in embedded occlusions 226 with edge-turning elements 224 which were previously disclosed. Rays 227 and 223 can be directed substantially orthogonally out of the wavelength conversion element 222.

Figure 21A:
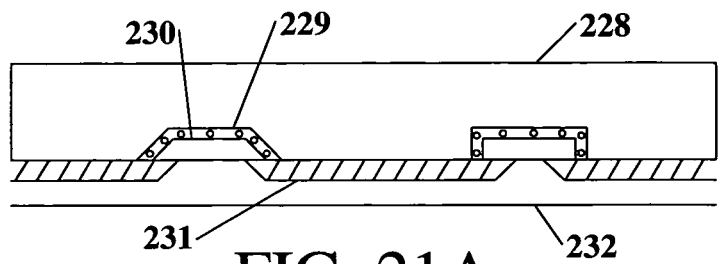
FIGS. 21A, 21B, and 21C depict side views of a light emitting patch source and its use with waveguiding materials of the present invention.

FIG. 21A depicts a LED die 230 bonded into a wavelength conversion element containing depressions or pockets 228 using a bonding layer 229, a electrical interconnect layer 231 and protective dielectric layer 232. As an example, a 500 microns thick Ce:YAG single crystal wafer is laser drilled to have a pocket into which lateral LED die 230 is placed and bonded using a polysilazane. The polysilizane is at least partially cured. The polysilazane is further coated using inkjet printing techniques to cover all but the metal contact pads of lateral LED die 230. Conductive ink is printed via, but not limited to, inkjet, screenprinting, tampo, or lithographic means such that the exposed metal contact pads of lateral LED die 230 are interconnected electrically via electrical interconnect layer 231. Nanosilver, silver paste, and other highly reflective printable electrically conductive inks, pastes or coatings are the preferred conductive ink. A protective dielectric layer 232 is applied via, but not limited to, inkjet, spin coating, dip coating, slot coating, roll coating and evaporative coating means.

Figure 21B:
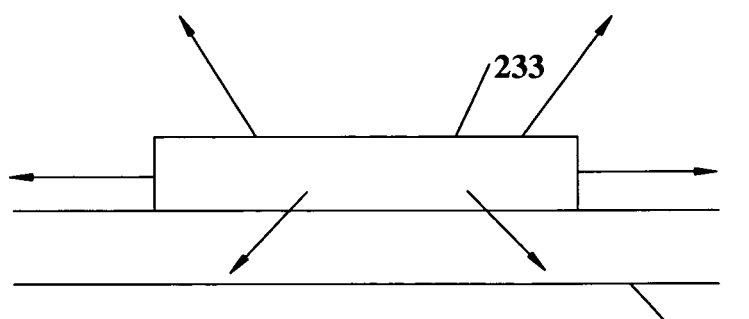
Figure 21C:
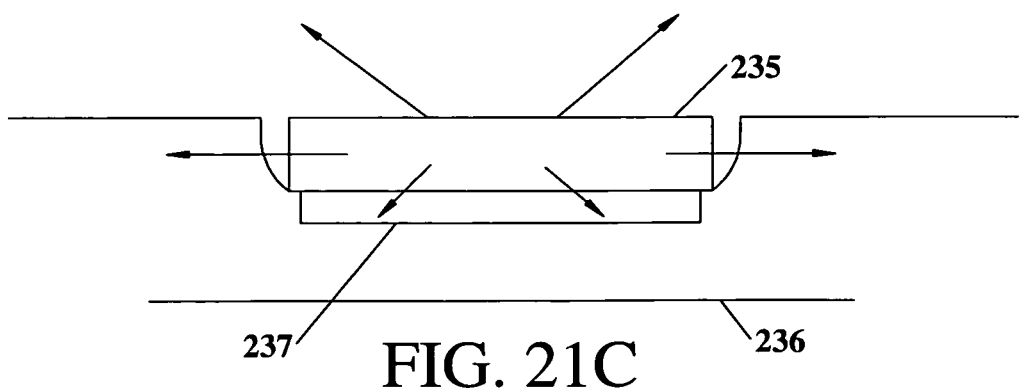

FIG. 21B depicts LED 233 mounted to the surface of waveguide 234 most of the rays do not couple to the waveguide efficiently. FIG. 21C depicts embedded LED 235 within a pocket in waveguide 236. Optically and thermally there is more coupling into waveguide 236. In addition the use of embedded LED 235 allows for simplified interconnect as depicted in FIG. 21A. Further luminescent insert 237 may be used to convert at least a portion of the spectrum from LED 233 or 235. In this case lower cost materials may be used for waveguide 234 and 236 respectively. As an example, single crystal Ce:YAG inserts 50 microns thick with a Ce doping concentration greater than 0.2% with substantially the same area as embedded LED 235 can be inserted into press sintered TPA waveguides. In this manner, the amount of luminescent material can be minimized while still realizing the benefit of a thermally conductive element including, but not limited to, waveguide, increased thermal cooling surface, and optical spreading of the light over an area larger than either luminescent insert 237 or LED 235. Ceramic, polycrystalline, amorphous, composite and pressed powders of luminescent materials may be used for luminescent insert 237. A waveguide 236 with a thermal conductivity greater than 1 W/m/K can work with a luminescent insert 237. LED 235 consists of one or more of the LED which is an InGaN, AlGaN, and/or AlInGaP based LED in waveguide 236 with a thermal conductivity greater than 1 W/m/K with at least one luminescent insert 237.

While the invention has been described in conjunction with specific embodiments and examples, it is evident to those skilled in the art that many alternatives, modifications and variations will be evident in light of the foregoing descriptions. Accordingly, the invention is intended to embrace all such alternatives, modifications and variations that fall within the spirit and scope of the appended claims.

The invention claimed is:

1. A self cooling light source comprising
a light emitting diode, and
a thermally conductive luminescent element on said light emitting diode, said thermally conductive luminescent element being a thermal spreading element for heat generated by said light emitting diode and said thermally conductive luminescent element, and said thermally conductive luminescent element being a light extraction means for light emitted by said light emitting diode.

2. The self cooling light source of claim 1 further comprising
wire bonds to prove electrical interconnects for said light emitting diode, and
a transparent/translucent bonding layer bonding said wire bonds to said thermally conductive luminescent element, said transparent/translucent bonding layer conducting heat generated by said light emitting diode and said thermally conductive luminescent element and said transparent/translucent bonding layer being a light extraction means for light emitted by said light emitting diode.

3. The self cooling light source of claim 2 wherein said transparent/translucent bonding layer is glass frit, polysiloxane, polysilazane, silicone, and other transparent/translucent adhesive materials.

4. The self cooling light source of claim 1 wherein said thermally conductive luminescent element is single crystal luminescent materials, polycrystalline luminescent materials, amorphous luminescent materials, thermally conductive transparent/translucent materials such as Sapphire, TPA, Nitrides, Spinel, cubic zirconia, quartz, and glass coated with a thermally conductive luminescent coating.

5. The self cooling light source of claim 1 further comprising
a high emissivity layer on said thermally conductive luminescent element, said high emissivity layer enhancing radiative cooling of heat generated by said light emitting diode and said thermally conductive luminescent element.

6. The self cooling light source of claim 5 wherein said high emissivity layer is glass frit, polysiloxane, polysilazanes, flame sprayed ceramics, and evaporative/CVD coatings.

7. The self cooling light source of claim 5 wherein said high emissivity layer is reflective to provide directionality to light emitted by said light emitting diode.

8. The self cooling light source of claim 5 wherein light emitted by said light emitting diode is emitted from both sides of said self cooling light source.

9. The self cooling light source of claim 1 further comprising two thermally conductive luminescent elements, said light emitting diode being partially or fully embedded in said two thermally conductive luminescent elements.

10. The self cooling light source of claim 1 further comprising two light emitting diodes, said two light emitting diodes being partially or fully embedded in said thermally conductive luminescent element.

11. The self cooling light source of claim 5 wherein in said thermally conductive luminescent element is Ce:YAG or a polycrystalline alumina with a thermally fused layer of Mn doped Strontium Thiogallate and a layer of Eu doped Strontium Calcium Sulfide within a glass frit matrix.

12. The self cooling light source of claim 5 wherein said thermally conductive luminescent element is a translucent reflector.

13. The self cooling light source of claim 1 further comprising additional cooling means of heatpipes, metals, glass, ceramics, or plastics to conduct heat generated by said light emitting diode and said thermally conductive luminescent element and to diffuse, reflect or absorb light emitted by said light emitting diode.

14. The self cooling light source of claim 1 further comprising
electrical interconnects for said light emitting diode, said electrical interconnects formed by printing and lithographic means, and
a transparent/translucent bonding layer connecting said electrical interconnects to said thermally conductive luminescent element, said transparent/translucent bonding layer conducting heat generated by said light emitting diode and said thermally conductive luminescent element and said transparent/translucent bonding layer being a light extraction means for light emitted by said light emitting diode.

15. The self cooling light source of claim 14 wherein said electrical interconnects are a transparent/translucent dielectric layer.

16. The self cooling light source of claim 14 wherein said electrical interconnects are silver conductive inks or thick film silver inks.

17. The self cooling light source of claim 14 wherein said electrical interconnects are partially or fully covered by a transparent/translucent overcoat to environmentally isolate or electrically isolate said self cooling light source.

18. The self cooling light source of claim 14 further comprising a luminescent layer on said transparent/translucent bonding layer.

19. The self cooling light source of claim 14 further comprising multiple self cooling light sources to create uniform illumination in the far field.

20. The self cooling light source of claim 1 wherein said light emitting diode is substrate free.

21. The self cooling light source of claim 1 wherein said thermally conductive luminescent element is non-flat, hemispheric in shape, curved in shape or rectangular saw tooth in shape.

22. The self cooling light source of claim 14 further comprising silver electrical interconnects on a TCO transparent/translucent bonding layer.

23. The self cooling light source of claim 1 further comprising an outer coating covering the ends of said self cooling light source to change the far field distribution of light emitted by said light emitting diode.

24. The self cooling light source of claim 1 wherein said outer coating is a scattering element of metal, diffuse scatterer, dielectric mirror, or translucent material within a matrix.

25. The self cooling light source of claim 23 wherein said self cooling light source has the shape of a candle flame and wherein said outer coating is spectrally variable such that red wavelengths are emitted more readily near the tip of said candle flame and blue wavelengths are emitted more readily near the base of said candle flame.

26. The self cooling light source of claim 1 wherein the active region of said light emitting diode for emitting light is non-square or rectangular in shape.

27. The self cooling light source of claim 1 further comprising a bonding layer between said light emitting diode and said thermally conductive luminescent element for bonding said light emitting diode to said thermally conductive luminescent element.

28. The self cooling light source of claim 1 wherein said thermally conductive luminescent element is a wavelength conversion element for light emitted by said light emitting diode.

29. The self cooling light source of claim 28 further comprising
a red emitting light emitting diode and
a blue emitting light emitting diode, said self cooling light source emitting light of a range of wavelengths.

30. The self cooling light source of claim 28 further comprising multiple light emitting diodes emitting multiple different colors of light.

31. The self cooling light source of claim 28 further comprising
two different color emitting light emitting diodes and
a barrier between said two different color emitting light emitting diodes, said barrier thermally isolating and electrically isolating said two different color emitting light emitting diodes, said self cooling light source being a dual color light source.

32. The self cooling light source of claim 28 wherein said thermally conductive luminescent element has Ce:YAG phosphor, said self cooling light source being a white light source.

33. The self cooling light source of claim 29 wherein self cooling light source being a white light source.

34. The self cooling light source of claim 1 wherein said thermally conductive luminescent element is a waveguide for light emitted by said light emitting diode.

35. The self cooling light source of claim 1 further comprising an optic to redirect light emitted by said light emitting diode.

36. The self cooling light source of claim 1 wherein said optic is an external moveable reflector.

37. The self cooling light source of claim 1 wherein the depth of embedding said light emitting diode in said thermally conductive luminescent element adjusts the far field distributions of light emitted by said light emitting diode.

38. A self cooling light source comprising
a light emitting diode, and
a thermally conductive wavelength conversion element on said light emitting diode, said thermally conductive wavelength conversion element being a thermal spreading element for heat generated by said light emitting diode and said thermally conductive wavelength conversion element, and said thermally conductive wavelength conversion element converting the wavelength of light emitted by said light emitting diode.

39. A self cooling solid state light source, comprising:
at least one light-emitting diode (LED) die; and
at least one thermally conductive luminescent element, wherein said luminescent element includes an electrical interconnect and functions as a wavelength converter, converting at least a portion of the light emitted by said LED die to a different wavelength range, and also functions as an optical waveguide for light emitted by said LED die, and also functions as a heat spreading element, spreading heat generated by said LED die over a greater cross-sectional area, and finally provides a high emissivity layer, for optimal coupling of emitted light from the light source.

40. A self cooling solid state light source as defined in claim 39, wherein said at least one thermally conductive luminescent element also functions as a device substrate.

41. A self cooling solid state light source as defined in claim 39, wherein said self cooling solid state light source further comprises an external interconnect.

42. A self cooling solid state light source as defined in claim 39, wherein said self cooling solid state light source further comprises an environmental enclosure for said LED die.

43. A self cooling solid state light source, comprising:
at least one light-emitting diode (LED) die; and
at least one thermally conductive luminescent element bonded to the at least one LED die;
wherein light is emitted from the LED die principally in a direction through the at least one luminescent element, and heat generated in the light source is transmitted principally in the same direction as the direction of light emission, whereby heat is dissipated from the light source by a combination of radiation, conduction and convection from the at least one luminescent element, without the need for a device heat sink.

44. A self cooling solid state light source as defined in claim 43, wherein the at least one luminescent element is bonded to the LED die by a bonding layer with high thermal conductivity.

45. A self cooling solid state light source as defined in claim 44, and further comprising a high emissivity layer formed on the at least one luminescent element.

46. A self cooling solid state light source as defined in claim 43, wherein the thermally conductive luminescent element functions as a wavelength converter, an optical waveguide, a heat spreader and a device substrate.

* * * * *